US011650349B2

(12) United States Patent
Obathani et al.

(10) Patent No.: US 11,650,349 B2
(45) Date of Patent: May 16, 2023

(54) GENERATING DYNAMIC RESERVOIR DESCRIPTIONS USING GEOSTATISTICS IN A GEOLOGICAL MODEL

(71) Applicant: Saudi Arabian Oil Company, Dhahran (SA)

(72) Inventors: Omar H. Obathani, Dhahran (SA); Bandar A. Alwehaibi, Dammam (SA); Saud A. Bin Akresh, Dhahran (SA); Faisal Thawad, Dammam (SA); Noor M. Anisur Rahman, Dhahran (SA)

(73) Assignee: Saudi Arabian Oil Company, Dhahran (SA)

( * ) Notice: Subject to any disclaimer, the term of this patent is extended or adjusted under 35 U.S.C. 154(b) by 399 days.

(21) Appl. No.: 16/928,825

(22) Filed: Jul. 14, 2020

(65) Prior Publication Data

US 2022/0018988 A1 Jan. 20, 2022

(51) Int. Cl.
*G01V 99/00* (2009.01)
*G06F 30/27* (2020.01)

(52) U.S. Cl.
CPC ............ *G01V 99/005* (2013.01); *G06F 30/27* (2020.01)

(58) Field of Classification Search
CPC .............................. G01V 99/005; G06F 30/27
USPC ......................................................... 703/10
See application file for complete search history.

(56) References Cited

U.S. PATENT DOCUMENTS

| | | |
|---|---|---|
| 4,803,873 A | 2/1989 | Ehlig-Economides |
| 7,274,993 B2 | 9/2007 | Hu et al. |
| 8,515,721 B2 | 8/2013 | Morton et al. |
| 8,682,624 B2 | 3/2014 | Mariethoz et al. |
| 8,843,353 B2 * | 9/2014 | Posamentier ........ G01V 99/005 703/2 |
| 9,805,144 B2 | 10/2017 | Ravalec et al. |
| 9,896,930 B2 | 2/2018 | Al-Nahdi et al. |
| 9,945,224 B2 | 4/2018 | Proett et al. |
| 2013/0096897 A1 | 4/2013 | Shahri |
| 2015/0120199 A1 | 4/2015 | Casey |

(Continued)

FOREIGN PATENT DOCUMENTS

EP 2748644 9/2017

OTHER PUBLICATIONS

Haas, A., and B. Noetinger. "Stochastic reservoir modelling constrained by well test permeabilities." Fifth International Geostatistics Congress. 1996. pp. 1-11. (Year: 1996).*

(Continued)

*Primary Examiner* — John E Johansen
(74) *Attorney, Agent, or Firm* — Fish & Richardson P.C.

(57) ABSTRACT

Methods and systems, including computer programs encoded on a computer storage medium can be used for generating dynamic reservoir descriptions using geostatistics in a geological model. Data processing techniques can be used by a computing system to automate processes for generating, and updating (e.g., in real-time), subsurface reservoir models. An integrated methodology and hardware systems are described for determining properties of a reservoir in a subterranean region using a geological model based on seismic data and transient pressure data. The methodology and automated approaches employ technologies relating to machine learning and artificial intelligence (AI) to process seismic data and information relating to seismic facies.

23 Claims, 16 Drawing Sheets

(56) References Cited

U.S. PATENT DOCUMENTS

2019/0025461 A1    1/2019  Wiener et al.
2021/0096277 A1*  4/2021  Zaki ........................ E21B 43/00

OTHER PUBLICATIONS

Otake, Mayu. "Hierarchical Geostatistical Modeling and History Matching Strategies in a Volcanic Formation." SPE Asia Pacific Oil and Gas Conference and Exhibition. SPE 115931. OnePetro, 2008. pp. 1-9. (Year: 2008).*

Cullick, A. S., et al. "Well-spacing study to develop stacked tight oil pay in midland basin." SPE Unconventional Resources Conference. SPE 168992-MS. OnePetro, 2014. pp. 1-14. (Year: 2014).*

Mezghani et al., "Conditioning Geostatistical Models to Flow Meter Logs," Paper SPE 65122 presented at the SPE European Petroleum Conference, Paris, France, Oct. 2000, 10 pages.

Haas et al., "Stochastic Reservoir Modeling Constrained by Well Test Permeabilities" Geostatistics, vol. 1, Jan. 1997, 501-511, 11 pages.

PCT International Search Report and Written Opinion in International Appln. No. PCT/US2021/041636, dated Oct. 29, 2021, 15 pages.

* cited by examiner

PRE-CALIBRATION

POST-CALIBRATION

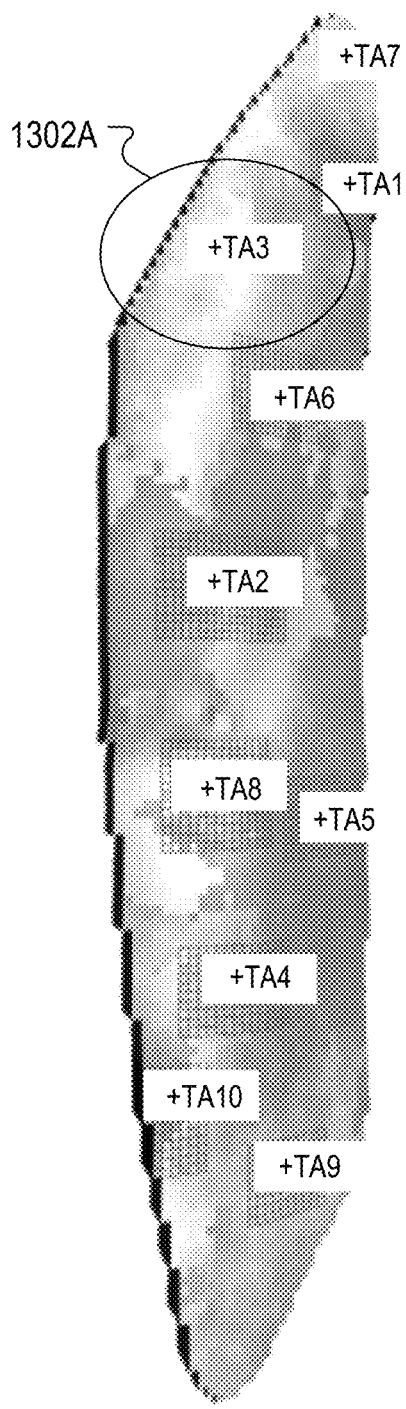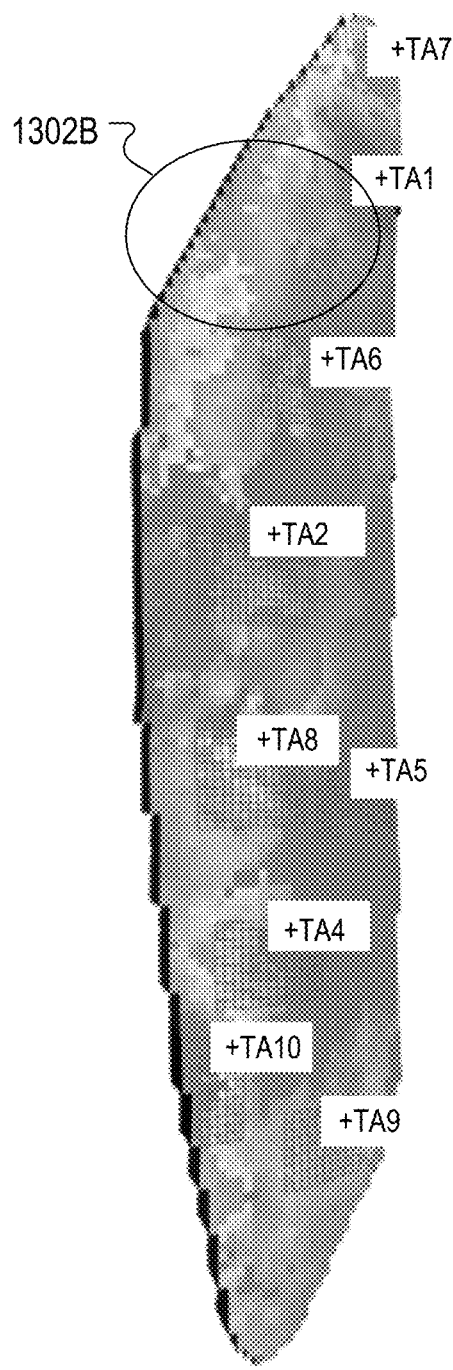
REMOVAL OF SECTOR MODEL TA3
POPULATING INTERMEDIATE REGIONS
FIG. 13A
FIG. 13B

GENERATING DYNAMIC RESERVOIR DESCRIPTIONS USING GEOSTATISTICS IN A GEOLOGICAL MODEL

TECHNICAL FIELD

This specification relates to determining properties and characteristics of a reservoir.

BACKGROUND

In geology, sedimentary facies are bodies of sediment that are recognizably distinct from adjacent sediments that resulted from different depositional environments. Generally, geologists distinguish facies by aspects of the rock or sediment being studied. Seismic facies are groups of seismic reflections whose parameters (such as amplitude, continuity, reflection geometry, and frequency) differ from those of adjacent groups. Seismic facies analysis is a subdivision of seismic stratigraphy and plays an important role in hydrocarbon exploration and is one key step in the interpretation of seismic data for reservoir characterization. The seismic facies in a given geological area can provide useful information, particularly about the types of sedimentary deposits and the anticipated lithology.

In reflection seismology, geologists and geophysicists perform seismic surveys to map and interpret sedimentary facies and other geologic features for applications such as identification of potential petroleum reservoirs. Seismic surveys are conducted by using a controlled seismic source (for example, a seismic vibrator or dynamite) to create a seismic wave. In land-based seismic surveys, the seismic source is typically located at ground surface. The seismic wave travels into the ground, is reflected by subsurface formations, and returns to the surface where it is recorded by sensors called geophones. Other approaches to gathering data about the subsurface (e.g., well logging) can be used to complement the seismic data.

Reservoir models based on data about the subterranean regions can be used to support decision making relating to field operations.

SUMMARY

The technology described in this document relates to reflecting characteristics of a reservoir in developing reliable reservoir properties in reservoir models by applying geostatistics to geological models. Wells with field data (for example, from transient tests or measured pressure history) are used to develop sector models. Each of these sector models is configured to model the dynamic conditions of a corresponding well of the reservoir, including nearby portions of the reservoir. The sector models are combined to form the basis for a dynamic reservoir model and geostatistics are used to populate the reservoir properties in intermediate regions between the sector models.

The sector models are tuned and calibrated using actual values from the field data. The pressure data and values obtained from applying geostatistics are combined with calibrated sector models to form a dynamic model of the reservoir. A validation process assesses the populated properties in the intermediate regions so that the most probable realization of geostatistical outputs can be chosen in the model. The system selects a realization that most accurately corresponds to the actual properties of the intermediate regions based on a unique methodology of running blind tests to validate the accuracy of the realization. The validation process used to calibrate properties of the intermediate regions in the reservoir model represents a core aspect of the described approach for creating the reliable dynamic full-field reservoir models.

Systems and methods for determining properties of a reservoir in a subterranean region using a geological model based on seismic data and transient pressure data include: obtaining the geological model of the reservoir with petrophysical properties; populating a dynamic model of the reservoir with the petrophysical properties from the geological model; obtaining transient pressure data from a plurality of wells in the reservoir; generating and calibrating a plurality of sector models, each of the plurality of sector models corresponding to one of the plurality of wells in the subterranean region: for each sector model, update corresponding portions of the dynamic model with data from the sector model; performing geostatistical distribution to populate portions of the dynamic model for intermediate regions between the plurality of sector models; and calibrating the petrophysical properties of the intermediate regions of the dynamic model by: selecting one of the plurality of sector models; removing data associated with the selected sector model from the dynamic model; performing geostatistical distribution to populate petrophysical properties of the dynamic model for the selected sector model and intermediate regions between the selected sector model and adjacent sector models; and calibrating petrophysical properties for the intermediate regions between the selected sector model and adjacent sector models by running the dynamic model for the selected sector model and the intermediate regions between the selected sector model and adjacent sector models, comparing results of running the dynamic model with observed pressure test data for the selected sector model, and iteratively adjusting the petrophysical properties for the intermediate regions between the selected sector model and adjacent sector models until the model results for each value in a first set of values is within a threshold measure of accuracy to values in the transient pressure data for the well of the selected sector model.

Embodiments of these systems and methods can include one or more of the following features.

In some embodiments, calibrating the petrophysical properties of the intermediate regions of the dynamic model includes: selecting a second, different sector model of the plurality of sector models; removing data associated with the second, different sector model; performing geostatistical distribution to populate petrophysical properties of the dynamic model for the selected second sector model and intermediate regions between the selected second sector model and adjacent sector models; and calibrating petrophysical properties for the intermediate regions between the selected second sector model and adjacent sector models by running the dynamic model for the selected second sector model and the intermediate regions between the selected second sector model and the adjacent sector models. In some cases, calibrating the petrophysical properties of the intermediate regions of the dynamic model includes: comparing results of running the dynamic model with observed pressure test data for the selected second sector model, and iteratively adjusting the petrophysical properties for the intermediate regions between the selected second sector model and adjacent sector models until the model results for each value in a second set of values is within a threshold measure of accuracy to values in the transient pressure data for the well of the selected second sector model. In some cases, calibrating petrophysical properties for intermediate regions between the selected second sector model and adjacent sector models includes: estimating the second set of values, wherein the values of the second set of values are: estimated based on geostatistics applied to the transient pressure data for the well of the selected second sector model; and indicative of petrophysical properties for the well of the selected second sector model and the intermediate regions between the selected second sector model and adjacent sector models.

In some embodiments, systems and methods also include validating accuracy of the first set of values in response to determining each value in the first set of values that indicate petrophysical properties of the intermediate regions between the selected sector model and adjacent sector models is within the threshold measure of accuracy to corresponding values in the seismic data and transient pressure data for the well of the selected sector model; and integrating the first set of values into the dynamic model to generate an updated dynamic model of the reservoir that models dynamic properties of the reservoir. In some cases, systems and methods also include validating accuracy of the second set of values in response to determining each value in the second set of values that indicate petrophysical properties of the intermediate regions between the selected second sector model and adjacent sector models is within a threshold measure of accuracy to corresponding values in the seismic data and transient pressure data for the well of the selected second sector model; and integrating the second set of values into the dynamic model to generate the updated dynamic model of the reservoir that models dynamic properties of the reservoir.

In some embodiments, the subterranean region includes a plurality of intermediate regions each intermediate region being associated with at least one of the plurality of wells and the method further includes: iteratively, for each of the plurality of sector models: selecting a particular sector model; removing data associated with the particular sector model from the dynamic model; performing geostatistical distribution to populate petrophysical properties of the dynamic model for the particular sector model and the intermediate regions between the particular sector model and adjacent sector models; and calibrating petrophysical properties for the intermediate regions between the particular sector model and adjacent sector models by running the dynamic model for the particular sector model and the intermediate regions between the particular sector model and adjacent sector models, comparing results of running the dynamic model with observed pressure test data for the particular sector model, and iteratively adjusting the petrophysical properties for the intermediate regions between the selected sector model and adjacent sector models until the model results for each value in a particular set of values is within the threshold measure of accuracy to values in the transient pressure data for the well of the particular sector model. In some cases, systems and methods also include validating accuracy of the particular set of values in response to determining each value in the particular set of values that indicate petrophysical properties of the intermediate regions between the particular sector model and adjacent sector models is within a threshold measure of accuracy to corresponding values in the seismic data and transient pressure data for the well of the particular sector model. In some cases, systems and methods also include integrating the particular set of values into the dynamic model to generate an updated dynamic model of the reservoir; and in response to integrating the particular set of values, generating the updated dynamic reservoir model that models the dynamic properties of the reservoir at least by accounting for petrophysical properties specific to each intermediate region of the plurality of intermediate regions in the subterranean region. In some cases, systems and methods also include modeling, using the updated dynamic reservoir model, dynamic behaviors and actual operating conditions of the reservoir, including modeling dynamic behaviors and actual operating conditions of each of the plurality of wells and each of the plurality of intermediate regions.

In some embodiments, integrating the first set of values into the dynamic model to generate the dynamic model of the reservoir comprises reinserting, into the dynamic model, the removed data associated with the selected sector model.

Other implementations of this and other aspects include corresponding systems, apparatus, and computer programs, configured to perform the actions of the methods, encoded on computer storage devices. A computing system of one or more computers or hardware circuits can be so configured by virtue of software, firmware, hardware, or a combination of them installed on the system that in operation cause the system to perform the actions. One or more computer programs can be so configured by virtue of having instructions that are executable by a data processing apparatus to cause the apparatus to perform the actions.

The subject matter described in this specification can be implemented to realize one or more of the following advantages. The described techniques provide an improved methodology for accurately determining properties of intermediate regions between sectors of a reservoir. The methodology of leveraging geostatistics to reliably compute reservoir properties and integrating performance of blind tests on populated intermediate regions represent an improvement over the manual, antiquated approaches of the prior art. For example, the improved techniques of this disclosure allow for accurate computing of reservoir properties in the intermediate regions without systematic bias or other inaccuracies associated with other techniques.

Reservoir models are expected to mimic dynamic features as observed in actual reservoirs to enhance the reliability and confidence of the reservoir models. Integration of transient-test results with geology, geophysics, petrophysics and geostatistics with reservoir models will advance this cause.

The details of one or more embodiments of these systems and methods are set forth in the accompanying drawings and the following description. Other features, objects, and advantages of these systems and methods will be apparent from the description and drawings, and from the claims.

BRIEF DESCRIPTION OF THE DRAWINGS

FIGS. 13A and 13B each show an example illustration of sectors in a geological model during performance of a blind pressure-transient analysis test at a particular sector.

Like reference numbers and designations in the various drawings indicate like elements.

DETAILED DESCRIPTION

Transient well tests are experiments performed on hydrocarbon and water wells under controlled environments for collecting transient-pressure data through downhole gauges. The collected pressure data, in combination with fluid production or injection rates, and the rock and fluid properties are utilized to characterize the well and an intersected reservoir within a drainage area associated with the well. Utilization of such transient-test data can be expanded to calibrate full-field, geological models to capture the dynamic behavior of various intermediate regions of the reservoir. Sometimes the duration of the test is long enough to represent the drainage area of the corresponding well.

Calibrating properties beyond the drainage area of specific wells for accurate modeling of dynamic properties in intermediate regions is a challenging step in developing a dynamic reservoir model. This specification describes systems and techniques for converting a full-scale, static geological model into a dynamic reservoir model that accurately models properties of individual wells and intermediate regions between wells of a reservoir. The systems and techniques can be implemented to overcome the challenge discussed earlier by populating the intermediate regions based on data derived with statistical tools (e.g., geostatistics), while complying with the properties around the well that are represented in sector models calibrated with transient-test data.

The statistical tools include using geostatistical processes to extrapolate, interpolate, or otherwise estimate properties of intermediate regions of the reservoir. Because the statistical tools can result in multiple realizations, such as multiple sets of properties for these intermediate regions, a validation step is employed so that the populated properties of selected realizations for the intermediate regions, e.g., regions beyond the drainage area, are compatible with those in the reservoir. This enables the observed transient and long-term pressure behaviors to be honored and accounted for in the dynamic reservoir model.

Figure 1:
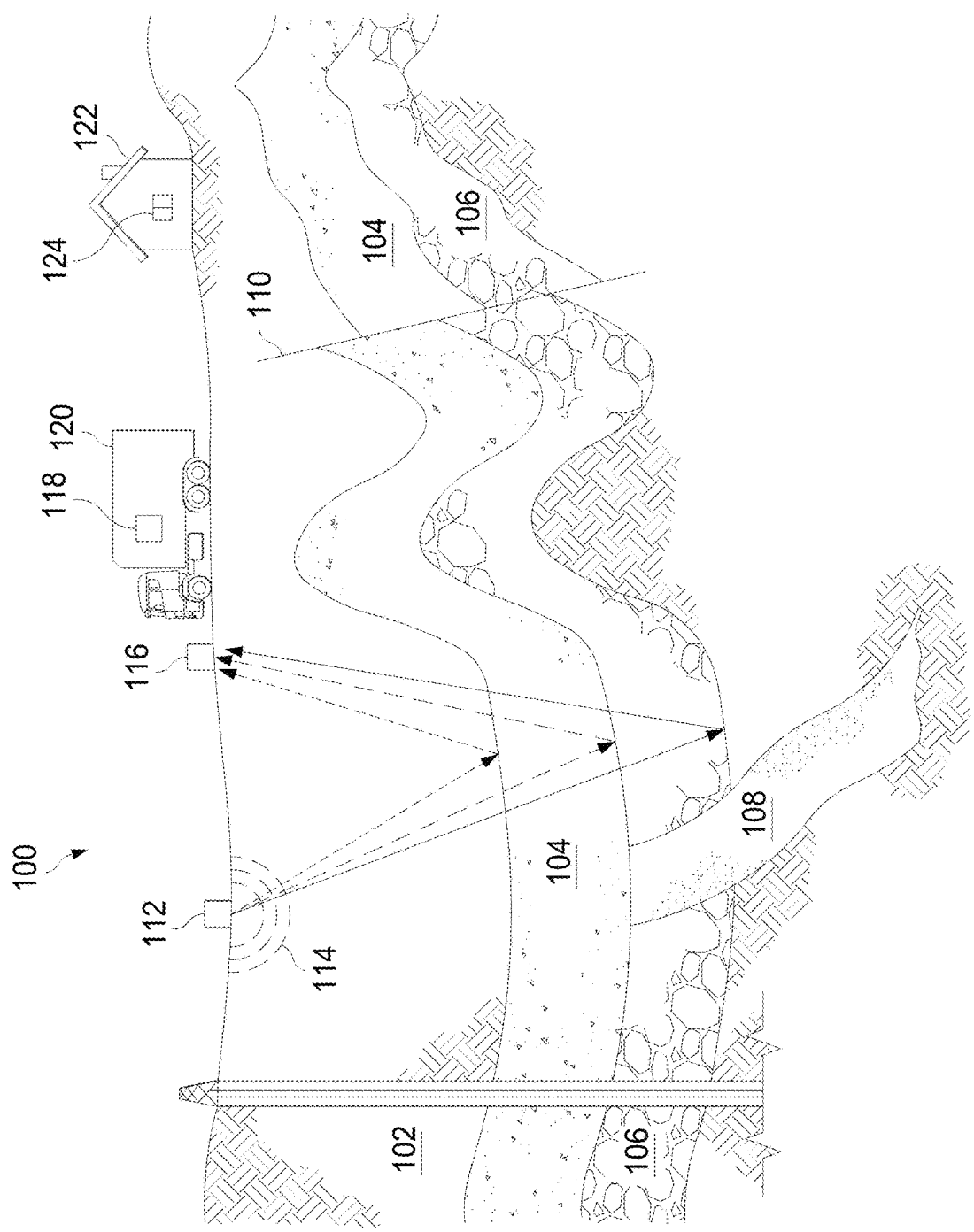
FIG. 1 is a schematic view of a seismic survey being performed to map subterranean features such as facies and faults.

FIG. 1 is a schematic view of a seismic survey being performed to map subterranean features such as facies and faults in a subterranean formation 100. The subterranean formation 100 includes a layer of impermeable cap rocks 102 at the surface. Facies underlying the impermeable cap rocks 102 include a sandstone layer 104, a limestone layer 106, and a sand layer 108. A fault line 110 extends across the sandstone layer 104 and the limestone layer 106.

A seismic source 112 (for example, a seismic vibrator or an explosion) generates seismic waves 114 that propagate in the earth. The velocity of these seismic waves depends on properties that include density, porosity, and fluid content of the medium through which the seismic waves are traveling. Different geologic bodies or layers in the earth are distinguishable because the layers have different properties and, thus, different characteristic seismic velocities. For example, in the subterranean formation 100, the velocity of seismic waves traveling through the subterranean formation 100 will be different in the sandstone layer 104, the limestone layer 106, and the sand layer 108. As the seismic waves 114 contact interfaces between geologic bodies or layers that have different velocities, the interface reflects some of the energy of the seismic wave and refracts part of the energy of the seismic wave. Such interfaces are sometimes referred to as horizons.

The seismic waves 114 are received by a sensor or sensors 116. Although illustrated as a single component in FIG. 1, the sensor or sensors 116 are typically a line or an array of sensors 116 that generate an output signal in response to received seismic waves including waves reflected by the horizons in the subterranean formation 100. The sensors 116 can be geophone-receivers that produce electrical output signals transmitted as input data, for example, to a computer 118 on a seismic control truck 120. Based on the input data, the computer 118 may generate a seismic data output, such as a seismic two-way response time plot.

A control center 122 can be operatively coupled to the seismic control truck 120 and other data acquisition and wellsite systems. The control center 122 may have computer facilities for receiving, storing, processing, and analyzing data from the seismic control truck 120 and other data acquisition and wellsite systems. For example, computer systems 124 in the control center 122 can be configured to analyze, model, control, optimize, or perform management tasks of field operations associated with development and production of resources such as oil and gas from the subterranean formation 100. Alternatively, the computer systems 124 can be located in a different location other than the control center 122. Some computer systems are provided with functionality for manipulating and analyzing the data, such as performing seismic interpretation or borehole resistivity image log interpretation, to identify geological surfaces in the subterranean formation or performing simulation, planning, and optimization of production operations of the wellsite systems.

In some embodiments, results generated by the computer system 124 may be displayed for user viewing using local or remote monitors or other display units. One approach to analyzing seismic data is to associate the data with portions of a seismic cube representing the subterranean formation 100. The seismic cube can also display results of the analysis of the seismic data associated with the seismic survey. The results of the survey can be used to generate a geological model representing properties or characteristics of the subterranean formation 100.

Figure 2:
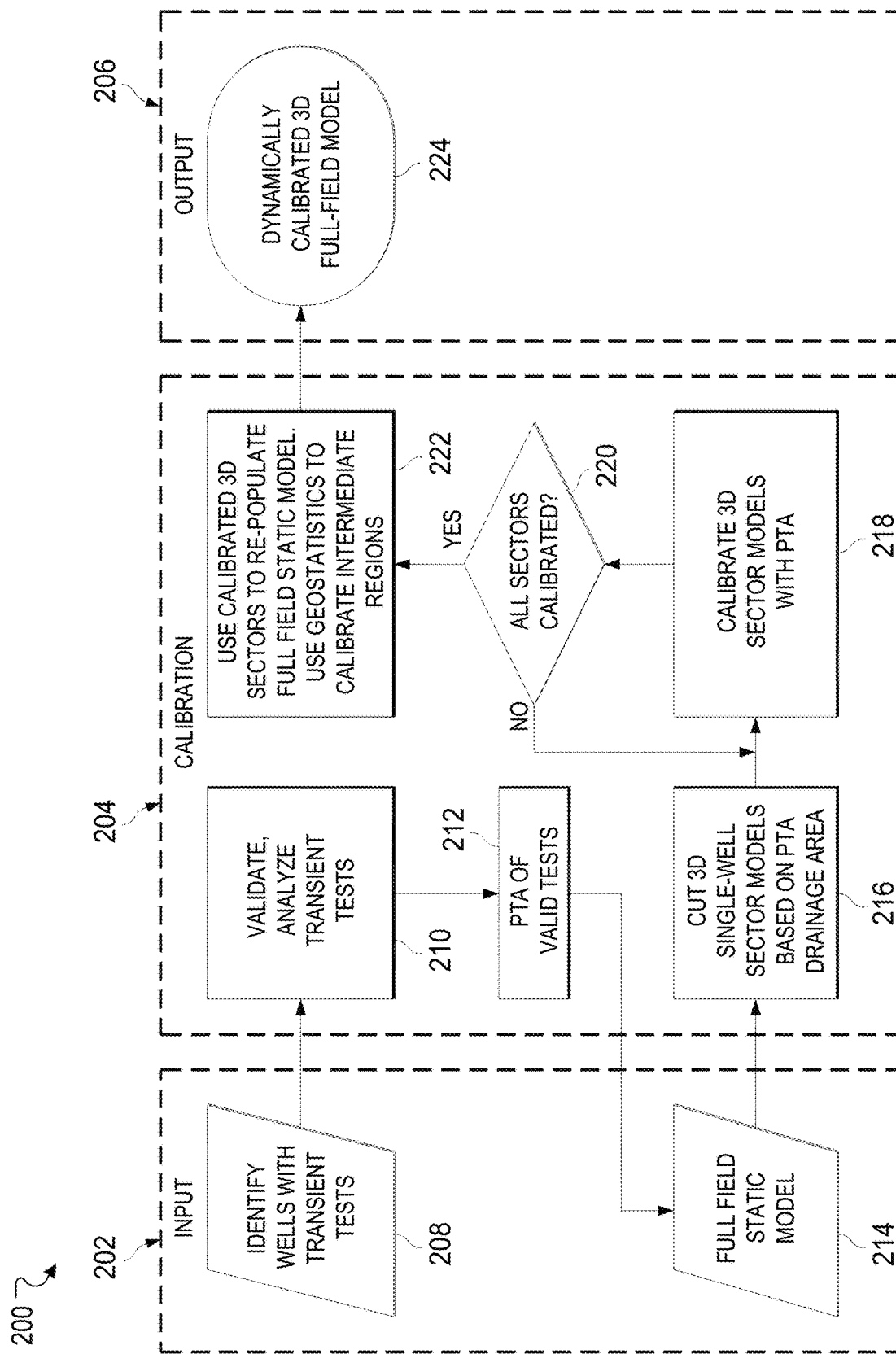
FIG. 2 illustrates an example workflow for developing reliable reservoir properties in a reservoir model.

FIG. 2 illustrates an example workflow 200 for developing reliable reservoir properties in a reservoir model. In the example of FIG. 2, a full-field, geological model is the subject on a workbench that is representative of a system used to develop or generate one or more data models. Each of the data models generated using the workbench can be sector models that integrate to form the basis for a dynamic reservoir model. Using this workbench, different types of data and operational tools are engaged to transform a static, geological model into a dynamic reservoir model. The dynamic reservoir model is configured to capture actual flow behaviors in the reservoir based on the model's processing of transient-test data and integration with geostatistical outputs.

In some implementations, the workbench is an example computing device used to generate predictive models for modeling properties and characteristics of a subterranean region. The predictive models can be used for modeling reservoir behavior in support of decision making relating to field operations. The computing device may be an example machine-learning engine included in the computer system 124 described earlier with reference to FIG. 1. For example, the computing device can be included in the computer system 124 as a sub-system of hardware circuits, such as a special-purpose circuit, that includes one or more processor microchips. The computing device can also be included in a computer system 170, which is described later with reference to FIG. 17.

The special-purpose circuitry can be used to implement machine-learning algorithms corresponding to learning techniques such as neural networks or support vector machines. In general, the computing device can include processors, for example, a central processing unit (CPU) and a graphics processing unit (GPU), memory, and data storage devices that collectively form one or more computing devices of computer systems 124.

The transient tests capture actual dynamic behaviors of a portion of a reservoir at and around a corresponding well. Transient behaviors and properties of wells or sectors of an underground formation as captured during a transient test are relayed to the geological model through transient data of rates and pressures. However, the influence of the transient data is limited to the radius of investigation around the subject well. As described in more detail later, transient-test data may not be available for intermediate regions beyond the radii of investigation. For these intermediate regions, the properties are obtained and calibrated using geostatistical tools. Use of these geostatistical tools to calibrate the intermediate regions may result in multiple realizations of reservoir properties.

The techniques for developing a reliable dynamic reservoir model include a validation process of performing blind tests with respect to different sectors or wells for which a calibrated sector model has been built. The validation process resolves selection of the realization that provides the closest correlation to actual properties of the intermediate regions in the underground formation. For example, the validation process is performed to obtain the most probable realization of intermediate regions between (or around) each of the wells. The selected realizations for the validation process are integrated in the geological model to develop a multi-dimensional dynamic reservoir model that models dynamic behaviors of a reservoir or underground formation.

Referring now to workflow 200, the workflow includes multiple phases corresponding to an input phase 202, a calibration phase 204, and an output phase 206. Wells with dynamic from transient tests or historical pressure data can be identified using one or more of the systems described in this document (208). In general, references to "the system(s)" corresponds to the computer system 124, the computing device, the computer system 1700, including the computer 1702 described later, or a combination of these. Data associated with each of the transient tests or historical pressure data can be validated and analysed using the system (210). The system performs pressure-transient analysis (PTA) of the valid transient tests (212). Transient tests are considered valid when the PTA can be performed on the test data to extract characteristic well and reservoir parameters. Persons skilled in the art can determine if the data contains adequate reservoir responses or not. Having the data with sufficient reservoir responses is a necessary condition for the data to be deemed valid.

Figure 7:
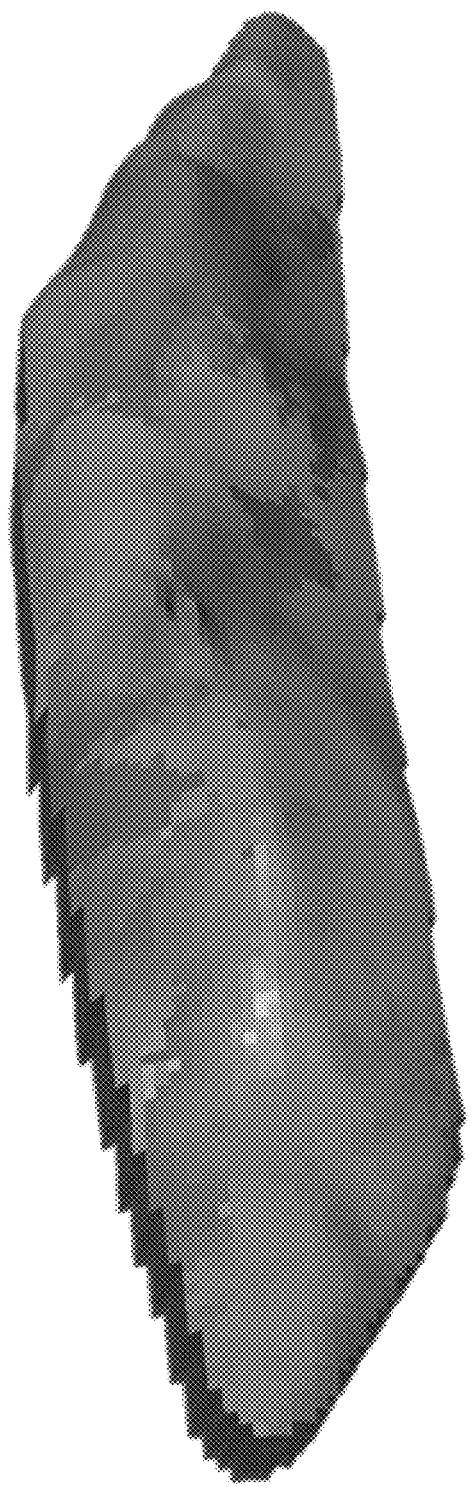
FIG. 7 is an example illustration of a three-dimensional (3D) full-field geological model.

The system generates a full-field, static model (214). An example representation of such a static model is shown in the example of FIG. 7, which is described later. The full-field, static model may be a geological model that is based, for example, on a seismic survey as described with regard to FIG. 1. Individual sector models are developed that correspond to a respective well among multiple wells of an underground formation that were identified as wells with transient-test data. The system cuts or removes a 3D or multi-dimensional single-well sector model based on the PTA of a drainage area (216). For example, the system removes a sector model for a single well to adjust or tune parameters of the model as a method of calibrating the model's outputs with reference to the actual values associated with the pressure-transient analysis of the valid tests at the particular sector represented by the model. The system then calibrates each respective sector model of the geological model based on the data values of the PTA corresponding to the valid tests for that sector (218).

Because the geological model includes multiple sector models, the system must determine whether all sectors are calibrated (220). If the system determines that all sector models are not calibrated, the system can loop back to the step of removing a particular multi-dimensional single-well sector model based on the PTA of a drainage area and calibrating the particular sector model. For example, the system can iterate through each sector identified as having available transient test data or measured pressure history until each of the sector models for those sectors are calibrated. This is described in more detail later at least with reference to FIG. 5 and FIG. 6.

If the system determines that all sector models are calibrated, the system re-populates the geological model with respect to each of the calibrated sector models (222). For example, the system uses data derived for the calibrated sectors to repopulate portions of the full-field, static model corresponding to the sector models. The system then uses geostatistics to populate intermediate regions of the multi-dimensional geological model. This process of re-populating the geological model and using geostatistics to calibrate intermediate regions is described in more detail later at least with reference to FIG. 6.

In general, workflow 200 provides an overview of a representative process for developing reliable reservoir properties in a dynamic reservoir model. Each of the respective steps of workflow 200 may be addressed in additional or more comprehensive detail with reference to the example workflows and/or illustrations of FIGS. 3-16, where each of these figures are described later in this document.

Figure 3:
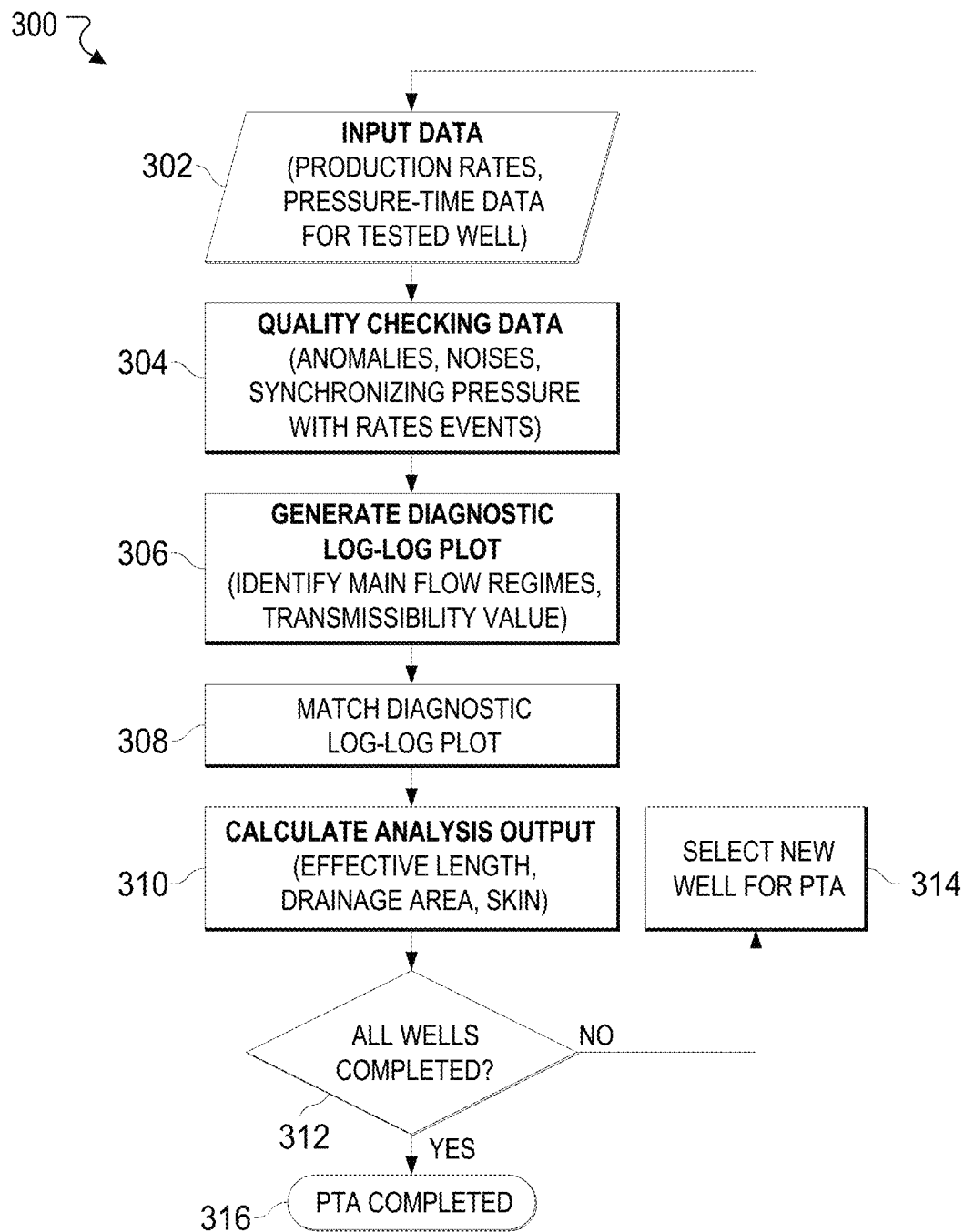
FIG. 3 illustrates an example workflow for performing pressure-transient analysis (PTA).

FIG. 3 illustrates an example workflow 300 for performing pressure-transient analysis (PTA). Each of the workflows described in this document, including workflow 200 described earlier with reference to FIG. 2, can be implemented or executed using the computer system 124 as well as the workbench, computing device, and/or machine-learning engine described earlier. Descriptions of the different workflows in this document may reference the computer system 124, including other computational resources associated with computer system 124 as described earlier (or later) in this document.

In some implementations, steps or actions of the different workflows are enabled by programmed firmware or software instructions, which are executable by one or more processors of the devices and resources described in this document. An example workflow may be referred to alternatively as a process or method of performing a particular set of tasks for generating dynamic reservoir descriptions using geostatistics in a geological model.

In the workflow 300, the system obtains or receives input data (302). For example, the input data can include production rates and pressure-time data for tested wells. The system performs a quality check of the received input data (304). For example, the system is operable to process the data values of an input set to detect or determine whether the input set includes certain anomalies and/or noise elements. In some cases, the system performs synchronizing of pressure with rate events as part of the quality check.

In some implementations, the input data is raw rate and pressure data. The workflow 300 summarizes of steps for how PTA is completed from the raw rate and pressure data. In some cases, high-resolution pressure and rate data may be required for performing a PTA. The system obtains such high-resolution data from transient tests or permanent downhole monitoring systems. In general, for pressure-transient well tests, pressures can be recorded as a function of time and interpreted using various analytical methods. For example, this can include performing buildup tests and drawdown tests in production wells and falloff tests in injection wells.

Procedures for analyzing pressure-transient well-tests can be based on mathematical relationships between flow rate, pressure, and time. The analysis of pressure changes over time, especially those associated with small variations in the volume of fluid. In most well tests, a certain amount of fluid is permitted to flow from an underground formation being tested and the pressure at the formation is monitored over time. In some cases the well is secured and the pressure is monitored while the fluid within the formation equilibrates. The analysis of these pressure changes can provide information about properties of the formation such as on the size and shape regions or reservoirs of the formation as well as its ability to produce fluids.

The system generates a diagnostic log-log plot (306). For example, the system generates a diagnostic log-log plot to analyze the PTA, including identifying or estimating main flow regimes and transmissibility values based on the log-log plots. In some implementations, a log-log plot represents a well testing tool, which may be also referred to as a derivative plot. The log-log plot allows for visualizing the flow behavior around a well, detecting the radial flow regimes and other flow regimes, detecting the presence of boundaries, etc.

The system is calibrated to match a diagnostic log-log plot (308). The system is operable to select a conceptualized model of the reservoir and to generate responses using the selected conceptualized model. In some cases, if the generated responses match the actual values associated with the input data, then the selected model may become the de facto description or characterization of the reservoir around the wellbore extending up the radius of investigation. The system calculates an analysis output (310). For example, the system calculates an analysis output with respect to effective length, drainage area, and skin associated with the well. The system determines whether all wells are completed (312). More specifically, the system determines whether PTA was performed for each well in an underground formation that was identified as having transient-test data and/or long term pressure history data.

If the system determines that PTA was not performed for these wells in the underground formation, the system can loop back to select a new well for which PTA is to be performed (314). If the system determines that PTA was performed for all wells in the underground formation, the system is operable to generate a notification indicating completion of PTA for each of the wells (316). The system can complete reservoir characterization based on a single-well analysis for each of the identified wells in an underground formation. As described in more detail later, this understanding or characterization of the reservoir is carried over to a geological model through the process of calibration in a respective sector model for each of the identified wells.

Figure 4:
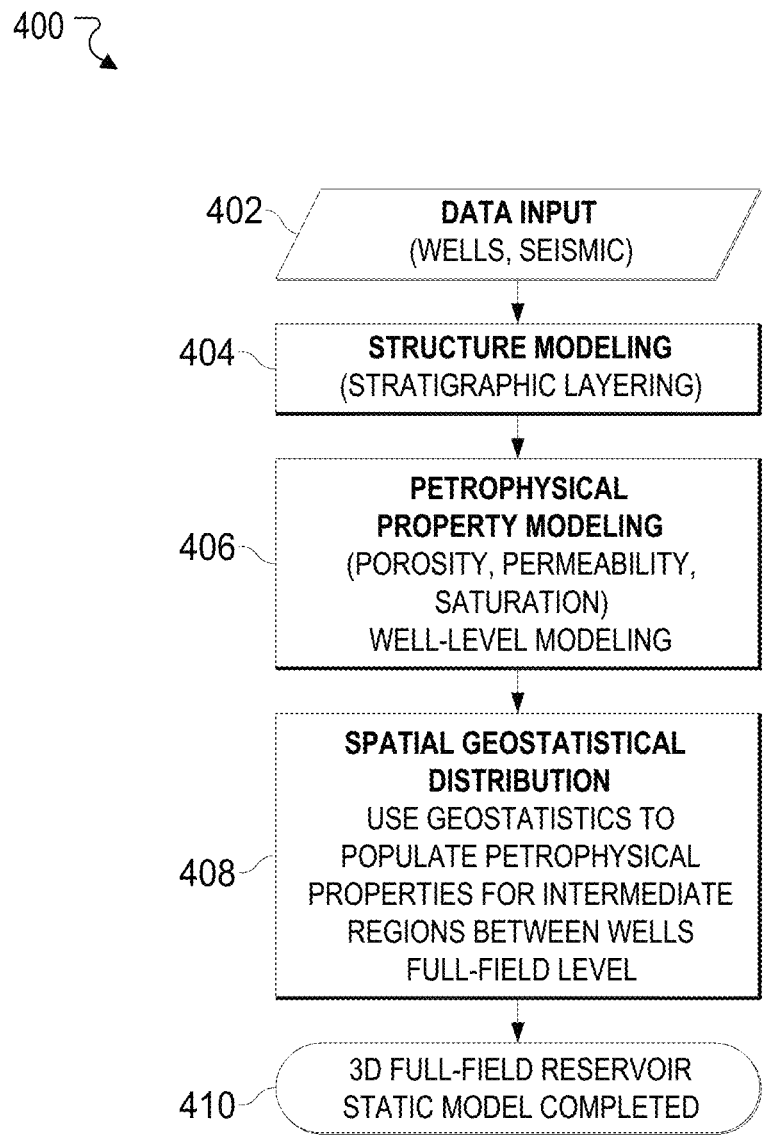
FIG. 4 illustrates an example workflow for generating a geological model.

FIG. 4 illustrates an example workflow 400 for generating a geological model based on, for example, field data obtained as discussed with reference to FIG. 1. The workflow 400 is implemented to build a geological model of a petroleum reservoir. The geological model generated based on the workflow 400 is configured to capture structural and property variations within the reservoir. As described earlier, an example completed static geological model is the subject for conversion into a dynamic reservoir model based on the described techniques for calibrating the sector models of an initial version of a dynamic model and then validating data obtained from geostatistics to calibrate intermediate regions of a reservoir.

Referring now to workflow 400, the system processes data inputs that include information and values for wells and seismic areas of an underground formation of a subterranean region (402). The system performs structure modeling based on the data inputs of the information set obtained based on, for example, field data obtained as discussed with reference to FIG. 1 (404). In some implementations, the system performs the structure modeling based on stratigraphic layering. The system performs petrophysical property modeling in response to performing the structure modeling. For example, the system performs petrophysical property modeling with reference to well-level modeling based on data and information associated with porosity, permeability, saturation of a given well location.

The system performs spatial geostatistical distribution to generate the geological model (408). For example, the system uses or applies geostatistics to populate petrophysical properties for intermediate regions between wells with respect to a full-field level of a reservoir. In some implementations, the system performs geostatistical distribution to populate portions of a dynamic model for intermediate regions between the different sector models. This process of spatial geostatistical distribution and application of geostatistics is described in more detail later, at least with reference to FIG. 6. A 3D or multi-dimensional full-field geological model is completed based on the prior steps of the workflow (410). For example, the system generates the geological model using the respective outputs of the petrophysical property modeling and the spatial geostatistical distribution of the intermediate regions.

In some implementations, this full-field model may be referred to as a preliminary dynamic reservoir model that requires further calibration and validation to accurately model dynamic properties of the reservoir. For example, the system can obtain a static geological model of the reservoir and populate a dynamic model (e.g., a preliminary model) of the reservoir using petrophysical properties from the static geological model. The system can also obtain transient pressure data from certain individual wells or sectors in the reservoir that are identified as having available transient test data or measured pressure history and generate calibrated sector models that are used to populate the dynamic model. The dynamic model and transient pressure for the individual wells may be processed with reference to respective workflows (e.g., work flows 500 and 600) for calibrating the sector models and validating populated properties of corresponding intermediate regions, as described later in this document.

Figure 5:
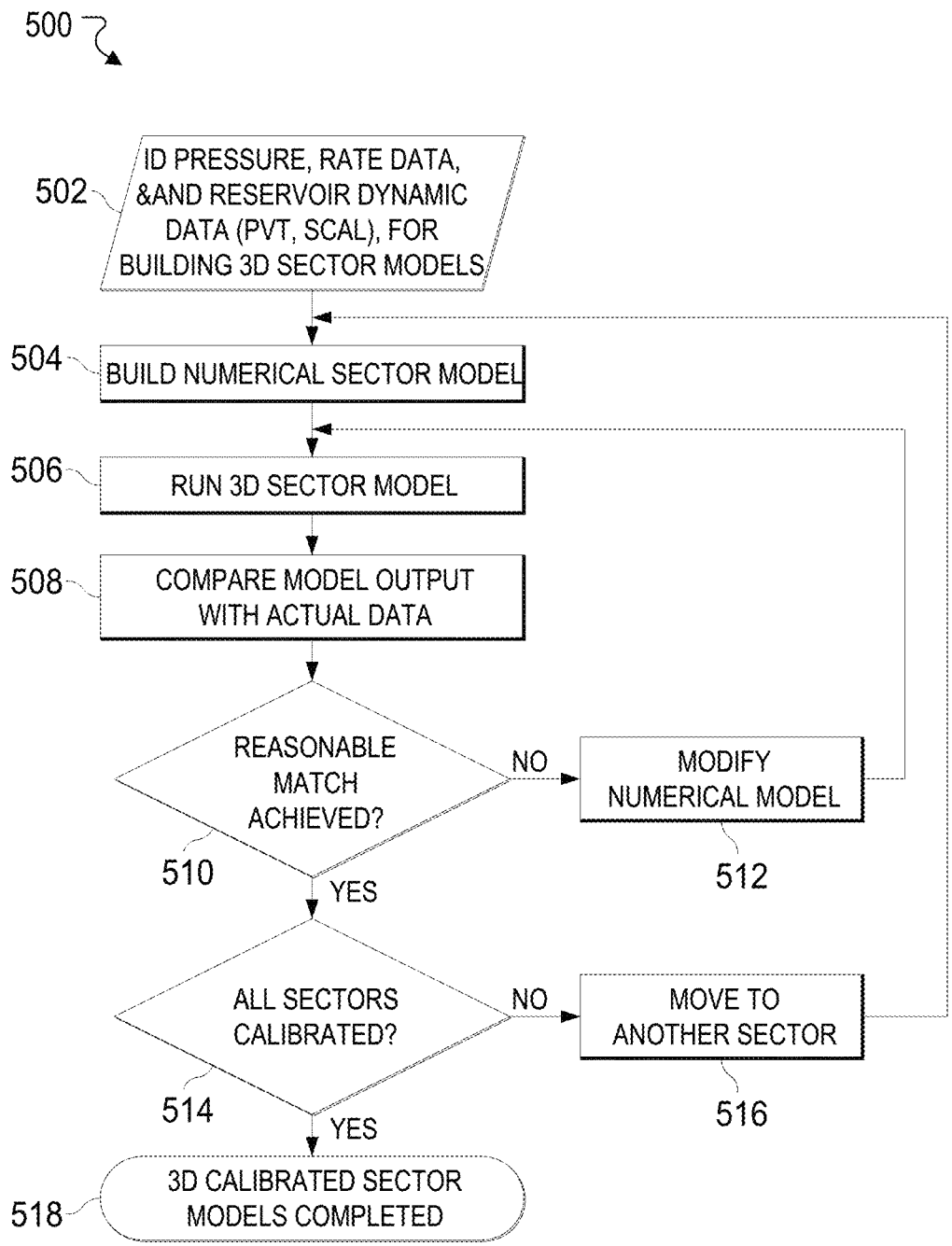
FIG. 5 illustrates an example workflow for calibrating a sector model.

FIG. 5 illustrates an example workflow for calibrating a sector model. For example, multiple sector models may be constructed based on the geological model. However, each of the sector models may not be sufficiently calibrated to generate accurate, reliable data outputs that are representative of its corresponding well properties. The workflow 500 is implemented to calibrate each of the sector models.

Referring now to workflow 500, a data set is obtained for use in calibrating each of the sector models of the geological model (502). For example, multiple respective data sets may be obtained where each respective data set pertains to a corresponding 3D sector model. Each of the data sets can include parameters and data values for pressures, rate data, reservoir dynamic data (e.g., PVT, SCAL).

In some implementations, data representing a particular sector model is extracted or pulled from the geological model. This particular sector model should contain data for a corresponding well location, where the well has a prior transient-pressure test or a long-term pressure history. Such a sector should be larger than the area of investigation that can be covered by the transient data. In some instances, a well-captured production- or injection-rate history with high-resolution pressure data is required to build a superior/ robust sector model that can be calibrated to truly reflect the actual reservoir behavior with the well.

The system performs one or more processes for building a numerical model for use in calibrating the sector model (504). For example, as described earlier, the system can include an example computing device that is operable to generate one or more machine-learning models corresponding to the multiple sector models of a static geological model. In some implementations, the system generates each of the multiple sector models at least by processing a respective data set of actual pressure values for a given well to train a corresponding sector model for the well. In some implementations, the process of building the numerical model corresponds to a process of tuning or adjusting an existing sector model to calibrate the sector model to cause the model output to match a particular set of actual data.

For a given well location, the system runs the 3D or multi-dimensional sector model for the well (506). For example, the system runs the sector model to simulate properties and conditions associated with the well and generates a model output with data values that are indicative of the properties. The system compares the parameter or data values of the sector model output for a simulation of the well properties with actual data values of the properties obtained for the well (508).

Based on this comparison, the system determines whether a reasonable match is achieved (510). To determine a reasonable match, the system (or a user) can set a particular threshold that defines whether a given result of a comparison is considered a reasonable match. For example, the threshold can be set such that a reasonable match is achieved when a comparison result indicates values of the model output are within a 10% difference with the actual values. Sometimes the system (or a user) can accept the maximum tolerable difference in pressures between the model output and the actual data as 50 psia for the purpose of deciding on a reasonable match.

The step of determining a reasonable match can correspond to a permeability-matching approach on a single-well basis. For example, by matching model pressures with the corresponding test pressures in a calibrated sector model, the system is configured such that the calibrated model has the same effective permeability as that of the actual reservoir within the radius of investigation of the test data. However, outside the radius of investigation, this test data does not have a significant relationship to the properties of the reservoir and, thus, cannot be relied on as being representative of properties outside the radius of investigation.

The system is operable to modify a numerical model in response to determining that a reasonable match has not been achieved (512). For example, the system can modify the numerical model by adjusting the model parameters or re-tuning a set of weights of the machine-learning model during a subsequent training iteration of the model. In some implementations, the system can adjust or tune a computational rule (or other attribute) encoded at the numerical model to modify the numerical (or sector) model. In addition the system can utilize machine-learning (ML), ML models, or Artificial Intelligence (AI) while adjusting the model parameters with the weights.

The system determines whether all sectors are calibrated (514). For example, the system is operable to set a calibration flag when a given sector model for a well outputs a set of data values that are a reasonable match to the actual data values for the well. The system can quickly scan the calibration flag for each sector/numerical model and determine whether: i) all sector models have been calibrated or ii) other sector models still require calibration. The system moves to another sector in response to determining that all sectors are not calibrated and initiates building (or adjusting) a numerical sector model for another well sector that requires calibration (516).

For example, the system is operable to: i) iterate through certain identified sectors of a reservoir to a construct a respective sector model for an identified well included in the sector and ii) calibrate the sector model for the well in response to determining that an output of the model matches, or substantially matches, data values of the actual transient-test data obtained for the well. In some implementations, the system is operable to calibrate multiple sector models concurrently. The system eventually determines that calibration of each of the multi-dimensional calibrated sector models is completed (518). For example, the system arrives at this determination in response to determining that comparison results for each of the sector models indicate a reasonable match has been achieved. A reasonable match is expected to meet two criteria. The first one is to confirm that the general pressure trend of the model conforms the trend of the actual pressure data. The second one is to meet the threshold value as set by the system (or a user), for example, the difference cannot exceed 10% or 50 psia in magnitude.

Figure 6:
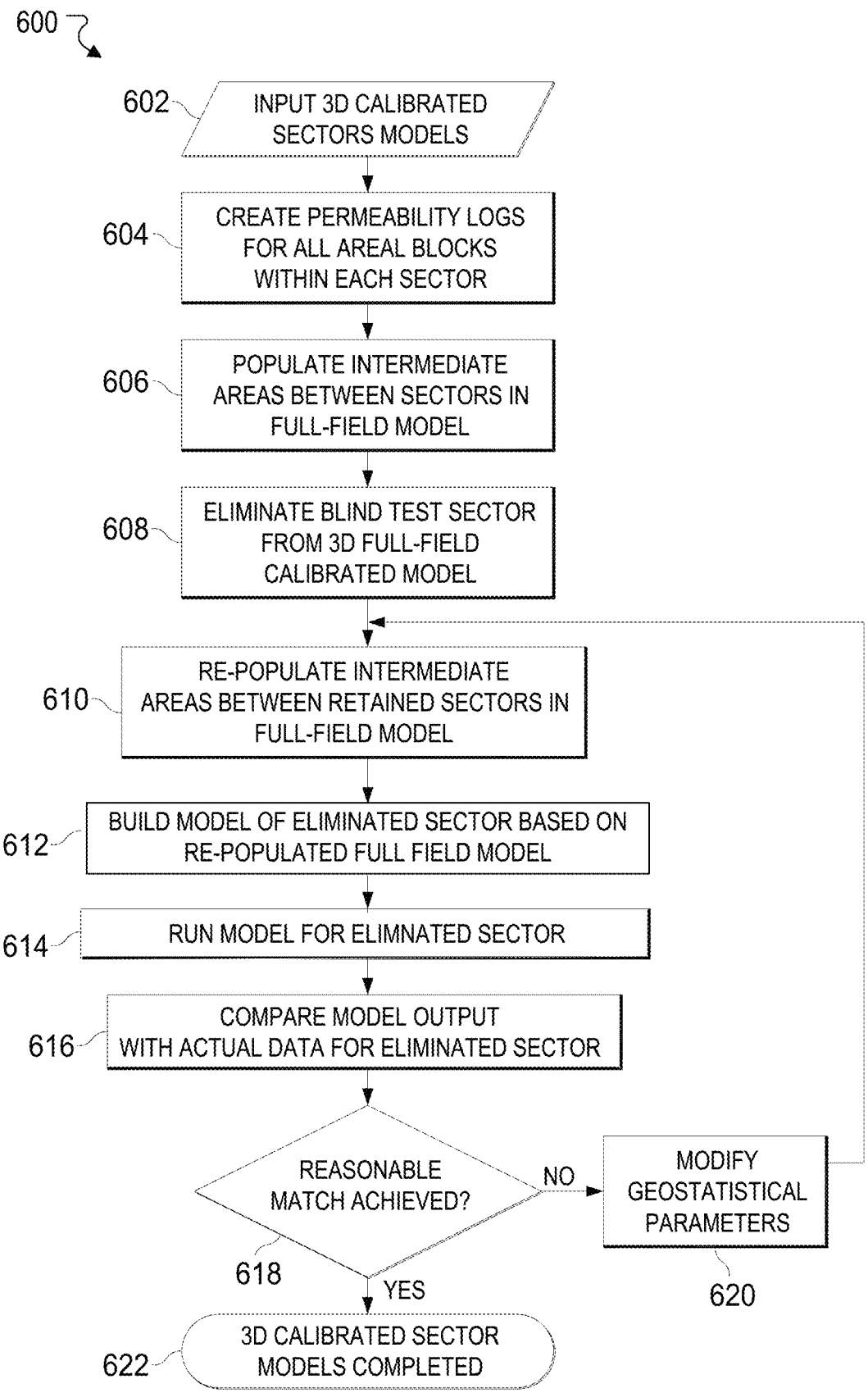
FIG. 6 illustrates an example workflow for calibrating intermediate regions in a dynamic geological model.

FIG. 6 illustrates an example workflow 600 for calibrating intermediate regions in a dynamic geological model. In general, the workflow 600 provides a methodology for populating reservoir properties for a dynamic reservoir model. In some implementations, the workflow 600 involves identifying regions of investigation around each of the single wells under the condition of reservoir heterogeneity in static geological models.

As described earlier, matching model pressures with the corresponding test pressures in a calibrated sector model allows the system to provide a calibrated model that has the same effective permeability as the actual reservoir within a radius of investigation of the test data. Outside the radius of investigation, this test data does not have a significant relationship to the properties of the reservoir and cannot be relied on as being representative of properties outside the radius of investigation. In view of this, the system employs another technique to calibrate properties outside the radii of investigation of individual wells. These areas that are outside the sector models that generally correspond to the radii of investigation of the individual wells are referred as "intermediate regions."

Calibration of intermediate regions follows the calibration of sector models, which is a matching process based on a single-well within individual sector models as described earlier. After completion of the sector model calibration, the regions outside the sector model still hold the static properties of the original geological model. Because the properties (for example, permeability) in the intermediate regions dictate the long-term performance of the wells, the system calibrates the intermediate regions such that long-term production (or injection) performance of each individual well is honored and/or accurately captured. Calibrating the intermediate regions is performed to accurately mimic the long-term production or injection performance of the individual wells.

Referring now to workflow 600, the system inputs the multi-dimensional calibrated sector models (602). For example, the system may obtain and input a calibrated sector model by obtaining data that is representative of the model and providing that data to a computing device that is operable to evaluate performance of the model outputs. As noted earlier, the calibrated sector models form a geological model, such as a full-field, static (or dynamic) geological model.

Figure 8:
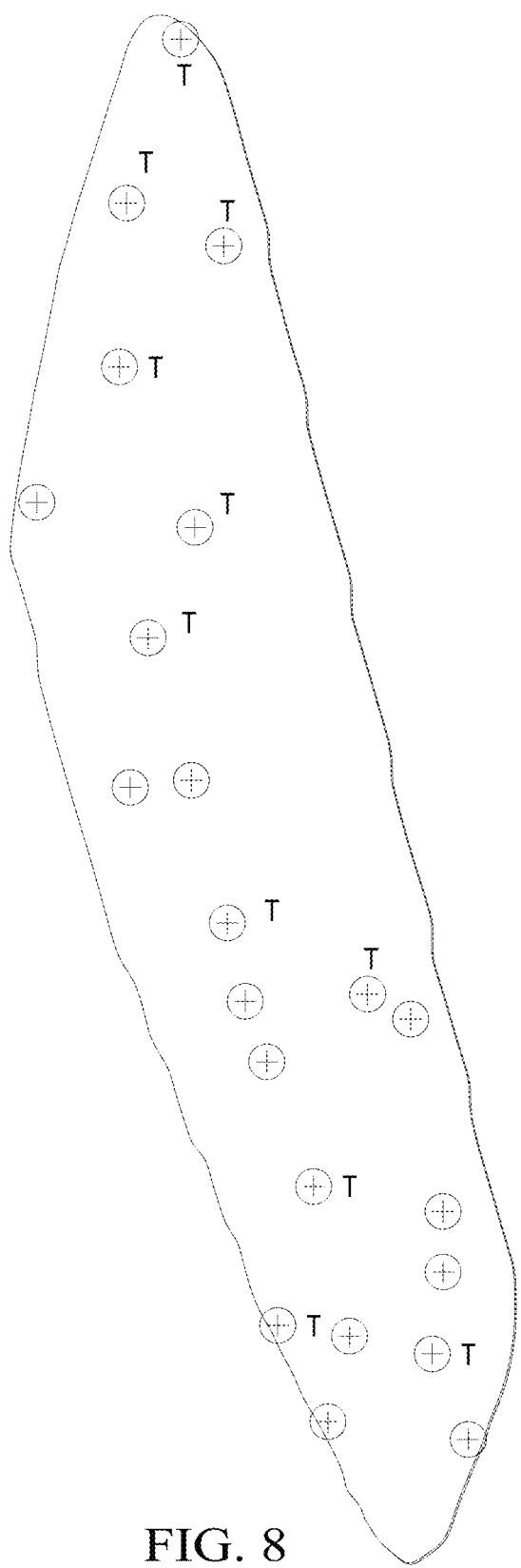
FIG. 8 illustrates an example aerial view of well locations included in a full-field geological model.

The system creates permeability logs for all areal grid blocks within each sector (604). For example, the system 100 can create a respective set of permeability logs for each of the aerial blocks. Each aerial block can correspond to an individual well and may include a surrounding area within a radii of investigation of the individual well. The example illustration of FIG. 8 shows aerial blocks representing the location of individual wells for an underground formation.

The system recalibrates (or populates) intermediate areas or regions between sectors in the full-field, static geological model based on geostatistical interpolation of values associated with the sector models utilizing all the calibrated sectors (606 For example, the system populates intermediate regions between at least two sectors in the underground formation using a methodology that is based on applying geostatistics. More specifically, the system is configured to use geostatistics to populate properties of the intermediate regions based on at least data values generated by the calibrated sector models. For example, the system can use one or more geostatistical methods to extrapolate or interpolate data values for populating petrophysical properties of the intermediate regions.

The system is configured to calibrate the intermediate regions by eliminating, for example, by removing or temporarily removing, a blind test sector from a 3D full-field calibrated model (608). Because the identified intermediate regions require statistical calibration so a dynamic reservoir model may be populated accurately with reservoir properties, the system uses a blind test methodology that includes removing a calibrated sector model, using geostatistics to populate petrophysical properties of that sector, and then validating accuracy of the populated properties against at least the prior transient-test data for that sector. For example, the system is operable to select the locations of blind tests by targeting wells where pressure-transient tests have been performed and actual pressure data is available. In some implementations, the system selects one of the multiple sector models and removes the data associated with the selected sector model from the dynamic model. In some other implementations, the system identifies or finds intermediate regions by excluding the single-well based regions of investigation.

After removing the blind test sector, the system then recalibrates (or re-populates) an intermediate region between the retained sectors in the full-field geological model (610), excluding the area of the blind test sector. For example, the system recalibrates an intermediate region that is adjacent or surrounds an area of the blind test sector (or well) and that is also between retained sectors in the full-field geological model. The system builds a model (612). For example, the system can build a numerical model of the eliminated sector based on the re-populated full-field model that was re-populated using geostatistics. The numerical model can be constructed based on the geostatistics used to re-populate the properties of the sector for which the sector model was eliminated or removed. For example, the system performs geostatistical distribution to populate petrophysical properties of the dynamic (or numerical) model for the selected sector model and one or more intermediate regions between the selected sector model and adjacent sector models. In some implementations, the system builds the numerical model in response to performing spatial geostatistical distribution, which can involve applying geostatistics to populate petrophysical properties for at least the sector of the eliminated sector model and its adjacent or surrounding intermediate regions.

The system runs the model as developed in step 612 corresponding to the numerical model for the eliminated sector to generate an output (614). For example, the system can run the multi-dimensional sector model to generate a model output describing properties of the well included in the eliminated sector model as well as the intermediate region recalibrated at step 610.

The system compares the model output of the numerical model generated based on geostatistics with actual data (616). For example, as noted earlier, the system can select a location of blind test by targeting a well where pressure-transient tests have been performed and actual pressure data is available. In this manner, the system can compare the model output that is run to actual data for a prior performance of a pressure-transient test. This allows comparisons of pressure responses in fictitious wells at the locations of blind tests from the numerical model (or previously calibrated model) with the measured pressures in the corresponding actual wells in the same locations.

The system 100 determines whether a result of the comparison indicates a reasonable match is achieved (618). If the system 100 determines that a result of the comparison indicates a reasonable match is not achieved, then the system 100 can loop back to step 610, or at least step 612, and modify geostatistical parameters of the numerical model (620). If the system determines that a reasonable match is achieved, then the system 100 can flag the result as a signal indicating that calibration of the multi-dimensional (e.g., 3D) numerical model is complete (622). In some implementations, any conformance resulting from comparisons in which the model output is compared with actual data can lead to the validation of the properties populated from geostatistics in the relevant intermediate regions that surround the eliminated sector.

In some implementations, workflow 600 is implemented by the system to calibrate petrophysical properties for the intermediate regions between the selected/eliminated sector model and adjacent sector models at least by running the dynamic numerical model for the selected sector model and the intermediate regions between the selected sector model and adjacent sector models. Running the dynamic numerical model includes comparing the results output by the numerical model with observed pressure test data for the sector, and iteratively adjusting the petrophysical properties for the intermediate regions between the selected sector model and adjacent sector models. For example, the petrophysical properties can be iteratively adjusted until the numerical model results for each value in a first set of values is within a threshold measure of accuracy to values in the transient pressure data for the well of the selected sector model.

Calibration of the intermediate regions also involves a process of validation as well. For example, after calibration of the regions outside a sector model, but prior to validation, the regions outside the sector models may be in harmony with the calibrated sector models in the full-field geological model; but this does not mean the intermediate regions are populated with the correct or most accurate distribution of properties. Implementation of the validation process enables all petrophysical properties within each of the sector models and within the intermediate regions to be consistent with (or match) the transient test results (or pressure-transient analysis, PTA) and any other long-term pressure histories of individual wells within the geological model.

As described earlier in this document, the techniques for developing a reliable dynamic reservoir model include a validation process of performing blind tests with respect to each of the different sectors or wells. The validation process resolves selection of the most probable realization that provides the closest correlation to actual properties of the intermediate regions in the underground formation. The validation process may be performed for each of the identified wells with transient-test data and measured pressure history to obtain the most probable realization of intermediate regions between (or around) at least each of these wells. The selected realizations for the validation process are integrated in the geological model to develop a multi-dimensional dynamic reservoir model that models dynamic behaviors of a reservoir or underground formation.

The system is operable to select one or more locations corresponding sectors and intermediate regions in the geological model for additional blind tests. The additional blind tests are performed to achieve overall validation of the geological model as a full-field calibrated dynamic reservoir model. The selected locations should already have prior transient tests or long-term pressure and production histories. In these locations the calibrated sector model is eliminated and pressure responses are generated with the geological numerical model that is built after re-populating intermediate regions between the retained sector models. The data values for the pressure response output by this numerical model are compared to those of transient tests or long-term pressure histories of the locations.

The system determines whether a satisfactory matching is achieved from the comparison. For example, the system can perform these additional blind tests and determine, for each test, whether a satisfactory matching is achieved at least by: i) selecting a calibrated sector model for removal from the geological model; ii) removing the selected sector model; iii) estimating a set of values for properties of a well and intermediate region associated with the sector model; and iv) validating accuracy of the set of values in response to determining that each value in the set is within a threshold measure of accuracy to values in the transient-test data generated for the selected location modeled by the sector model.

If the system determines that a satisfactory matching is achieved from the comparison, for example by validating accuracy of the values, then the system is configured to integrate the set of values into the geological model, including re-inserting the removed calibrated sector model. The system performs this step as part of the process for generating a dynamic model of the reservoir that models dynamic properties of the reservoir at least by accounting for properties of the intermediate region as well as the individual wells and sectors.

If a satisfactory matching is not observed between the generated pressure responses and the actual pressure data, the properties in the intermediate regions are subject to change or adjustment by the system. For example, the system can adjust the petrophysical properties to evaluate or test a different set of realizations or sets of values for a given sector model. When the system determines that each of the blind tests for the different sectors return results that demonstrate satisfactory matching, the final geological model is certified as the calibrated model with dynamic data.

FIG. 7 is an example illustration of a three-dimensional (3D) full-field, static geological model. In general, each of FIGS. 7-16 help to further illustrate the descriptions of the earlier workflows with examples that may be representative of actual data. The 3D view of FIG. 7 shows an example of a full-field, static geological model that is the subject of calibration and validation using the earlier workflows such that the static geological model becomes a dynamically-calibrated reservoir model. The system can use the example 3D view of FIG. 7 to identify all the wells, producers, and injectors, in the static geological model. Further, the system can identify which wells have been subject to prior transient tests or have measured downhole pressure measurements. This is described later with reference to FIG. 8.

Figure 9:
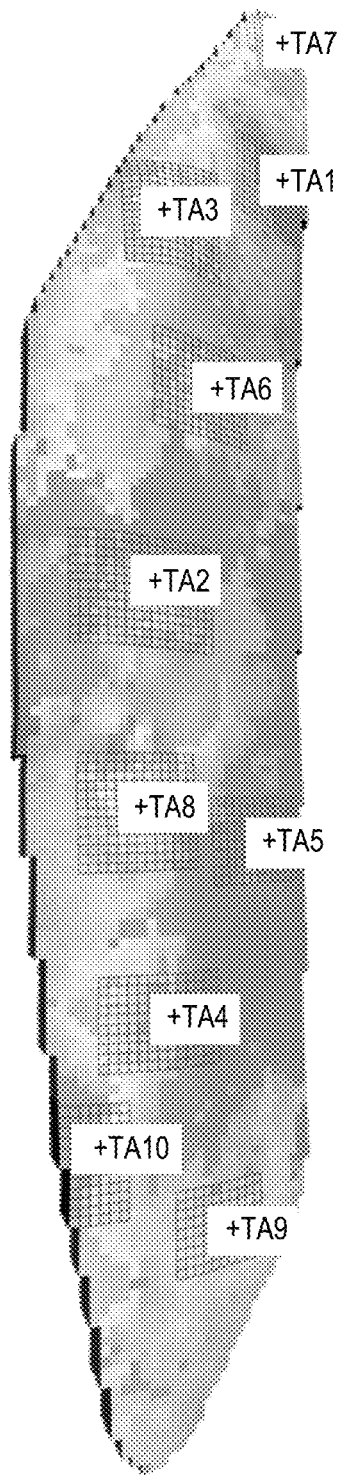
FIG. 9 is an example illustration of identified sectors in a geological model.

FIG. 8 illustrates an example aerial view of well locations included in a full-field geological model. In the example of FIG. 8, wells marked with a "T" have prior transient tests that have been previously performed or have pressure history data previously measured. FIG. 9 is an example illustration of identified sectors in a geological model. More specifically, the example illustration of FIG. 9 shows how each of the 10 sectors have been defined around the wells with transient-pressure data. The 10 sectors have been identified as TA1, TA2, TA3, TA4, TA5, TA6, TA7, TA8, TA9, and T10. In some implementations, each of the sector models corresponding to these respective sectors is conditioned with the respective pressure-transient data or measured pressure history.

Figure 10A:
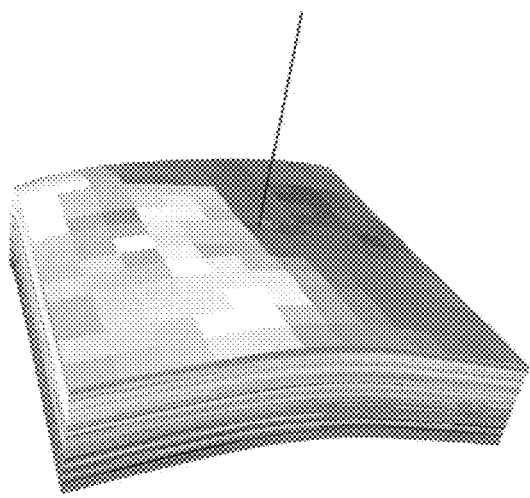
FIGS. 10A and 10B each show an example illustration of a permeability display of layers in a particular sector of a geological model.
Figure 10B:
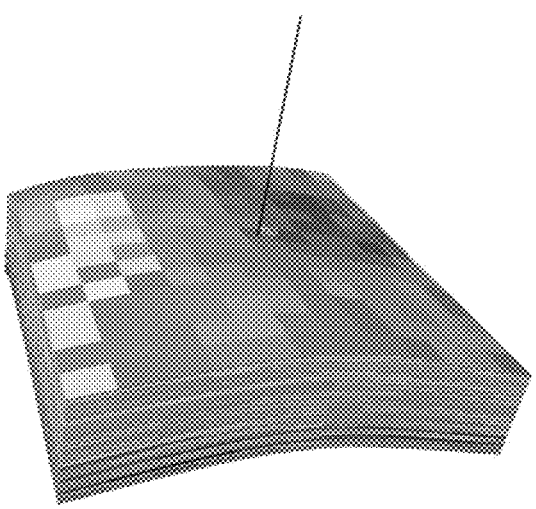

FIGS. 10A and 10B each show an example illustration of a permeability display of layers in a particular sector of a geological model. In some implementations, a model selected for removal may correspond to sector TA3. In this implementation, FIG. 10A shows a 3D view of sector model TA3 before conditioning (pre-calibration), whereas FIG. 10B shows a 3D view of sector model TA3 after conditioning (post-calibration). The contrasts in shades between the two pre- and post-calibration views show that the petrophysical properties of the sector TA3 have been adjusted after conditioning of the sector model.

Figure 11:
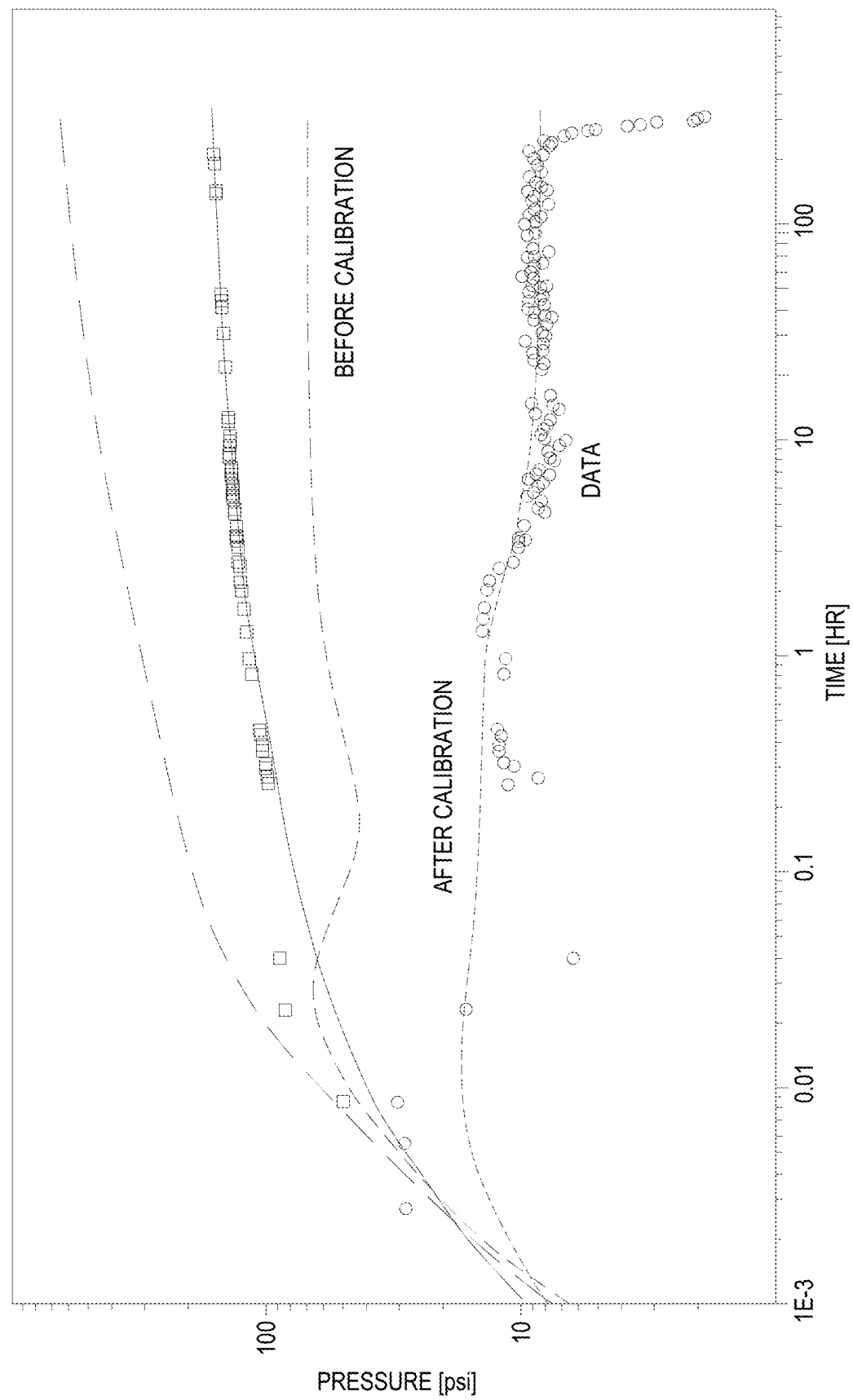
FIG. 11 shows example log-log plots of test data relating to pre-calibration and post-calibration of a particular sector.

FIG. 11 shows example log-log plots of test data relating to pre-calibration and post-calibration of a particular sector. For example, FIG. 11 shows a comparison of the log-log plots before and after calibration to the test data for sector TA3. FIG. 11 shows that the post-calibration sector model for TA3 has generated pressure responses, which match the test-pressure data. The use of log-log plots is one of multiple distinguishing features of the described techniques for generating dynamic reservoir descriptions using geostatistics in a geological model. For example, the system is configured to construct log-log plots of actual data and model responses in the blind tests described earlier. At least one technique employed by the system which is distinguished from the prior art involves comparing log-log plots of measured well-test data to model responses, and particularly for the blind test methodology.

Figure 12:
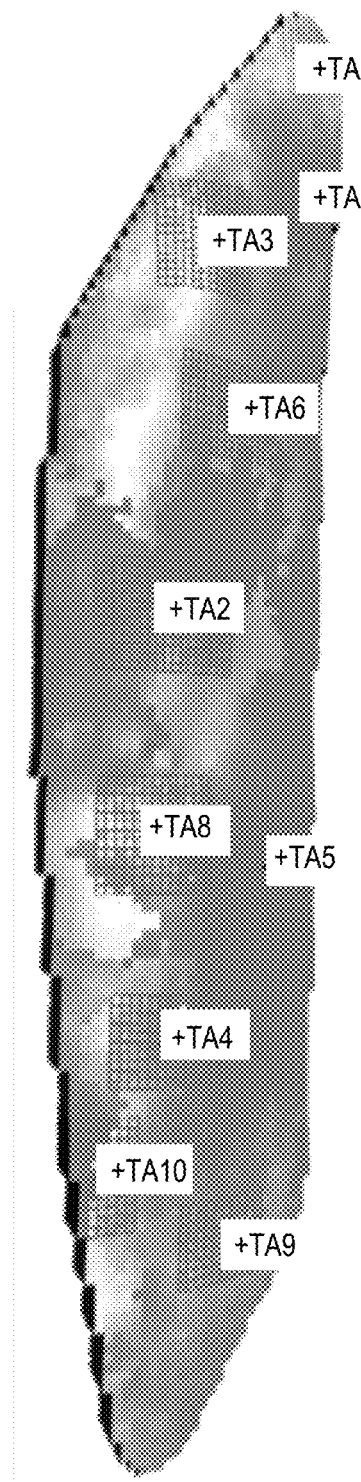
FIG. 12 is an example illustration of intermediate regions of a geological model that are populated with properties.

FIG. 12 is an example illustration of intermediate regions of a geological model that are populated with properties. Once all sector models are calibrated on a single-well basis, the system will then calibrate the intermediate regions outside the sector models. This is because the intermediate regions outside the sector models will still hold static properties of the original geological model. The example of FIG. 12 shows that the intermediate regions have been populated with petrophysical properties consistent with the calibrated properties of the sector models. As described earlier, geostatistical tools can be used to perform this operation.

FIGS. 13A and 13B each show an example illustration of sectors in a geological model during performance of a blind pressure-transient analysis test at a particular sector. FIGS. 13A and 13B present two required steps in performing a blind tests at a particular sector, such as sector TA3. First, as described earlier, the sector model is removed from the geological model as shown in FIG. 13A at area 1302A. The model is then populated with the properties based on geostatistics and a new realization is created for area 1302B as shown in FIG. 13B. With the new distribution of properties, pressure responses at sector TA3 are generated from the model and are compared to the measured pressures. If a satisfactory match is not obtained, the system will re-populate the model with another realization, generate a set of pressure responses using the re-populated model, and compare data values of the pressure responses to the measured pressures again until a reasonable match is obtained.

Figure 14:
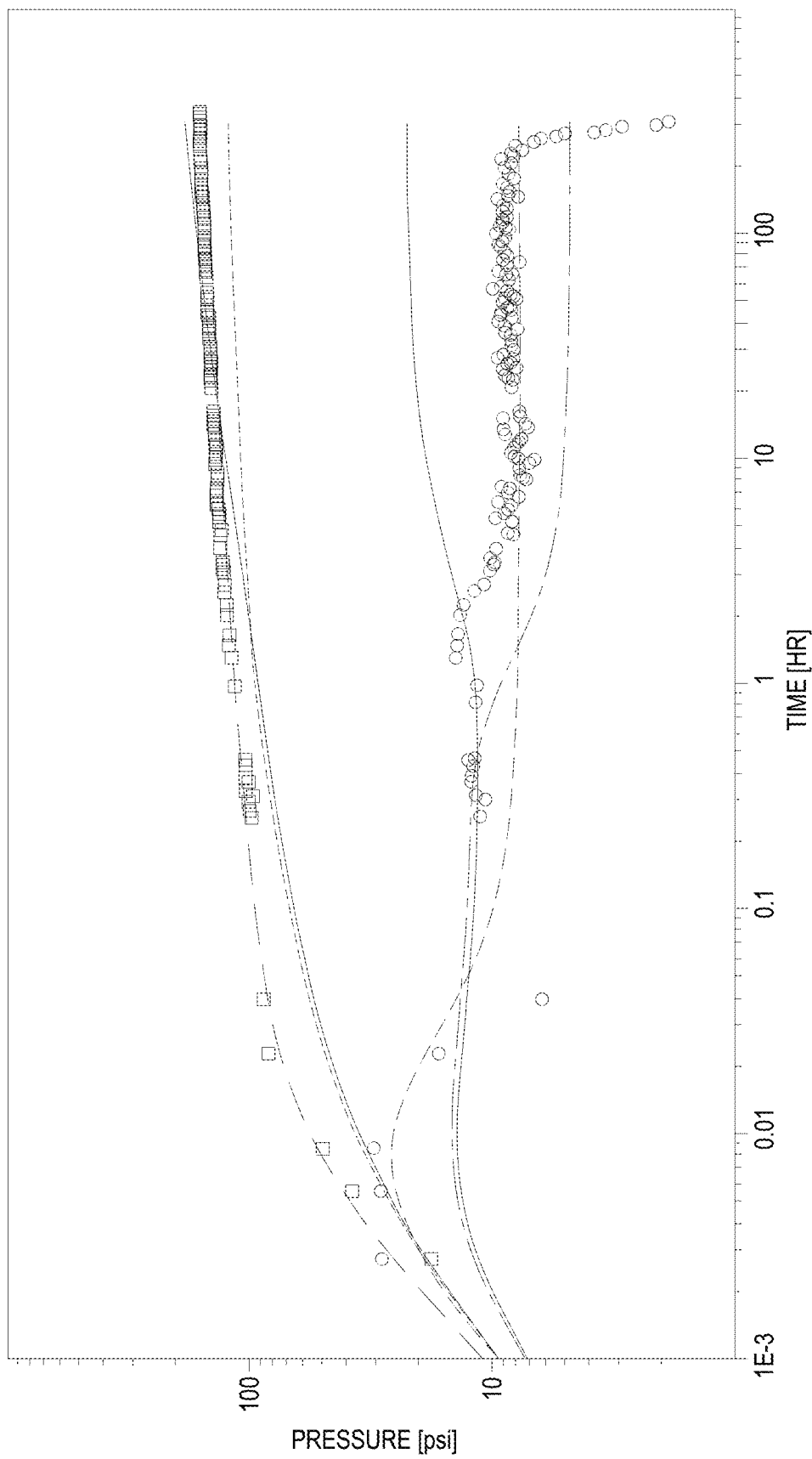
FIG. 14 shows an example comparative log-log plot illustrating measured values obtained for a blind pressure-transient analysis test at a particular sector.

FIG. 14 shows an example comparative log-log plot illustrating measured values obtained for a blind pressure-transient analysis test at a particular sector, such as sector TA3. The comparative log-log plot in the example of FIG. 14 shows a reasonable agreement of the permeability distribution has been achieved based on the geostatistical distribution. The comparative log-log plot of FIG. 14 captures the pressure-matching process to validate a realization in the intermediate region around TA3. The comparative log-log plot of FIG. 14 corresponds to the technique of constructing the log-log plots of actual data and model responses in the blind tests for comparing log-log plots of measured well-test data to model responses.

Figure 15:
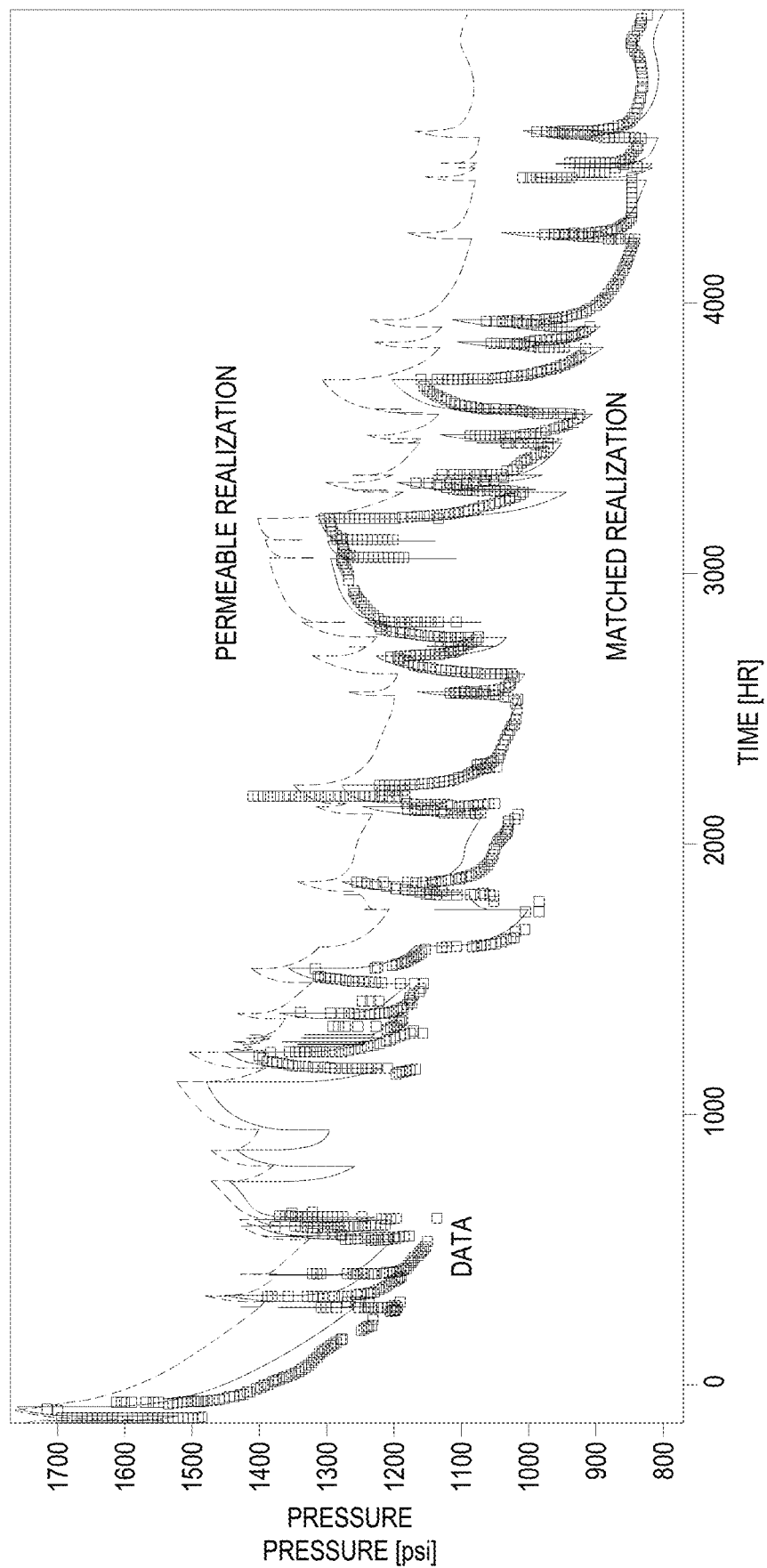
FIG. 15 shows an example of graphical data related to evaluation of a blind pressure-transient analysis test at a particular sector.

FIG. 15 shows an example of graphical data related to evaluation of a blind pressure-transient analysis test at a particular sector. Once each of the intermediate regions have a valid distribution of properties with an accepted realization suggested by geostatistics, the corresponding sector models are brought back into the geological model. For example, each of the sector models previously selected and removed are re-inserted back into the geological model.

Figures 16A, 16B:
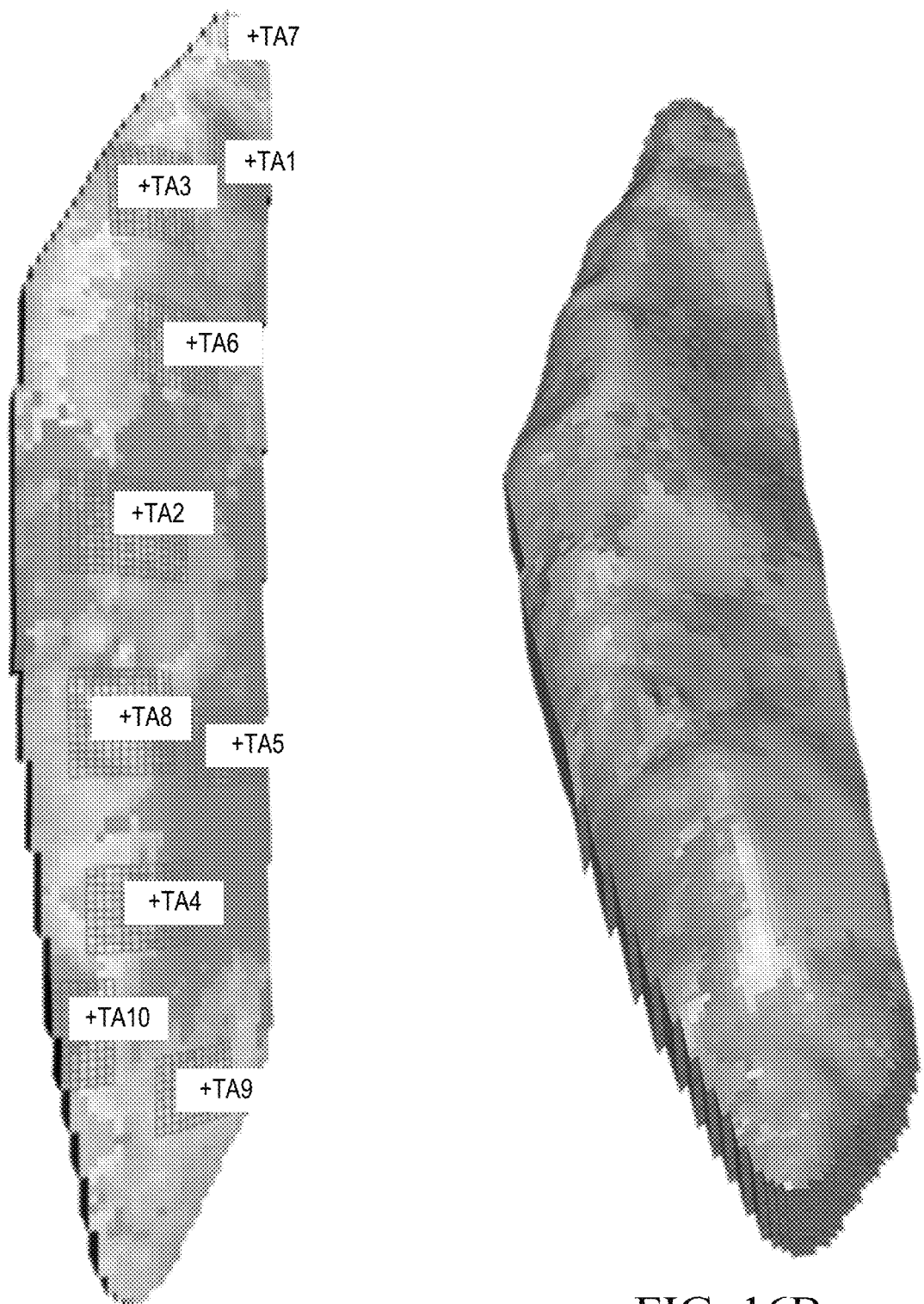
FIG. 16A shows an example illustration of sectors in a geological model following blind pressure-transient analysis tests.
FIG. 16B is an example illustration of a calibrated, full-field dynamic geological model.

FIG. 16A shows an example illustration of sectors in a geological model following blind pressure-transient analysis tests. As shown in FIG. 16A, the sector model for sector TA3 has been brought back to the geological model. The example of FIG. 16A also shows an aerial view of the entire geological model with calibrated sectors and realizations and FIG. 16B is an example illustration of a calibrated, full-field dynamic geological model.

Figure 17:
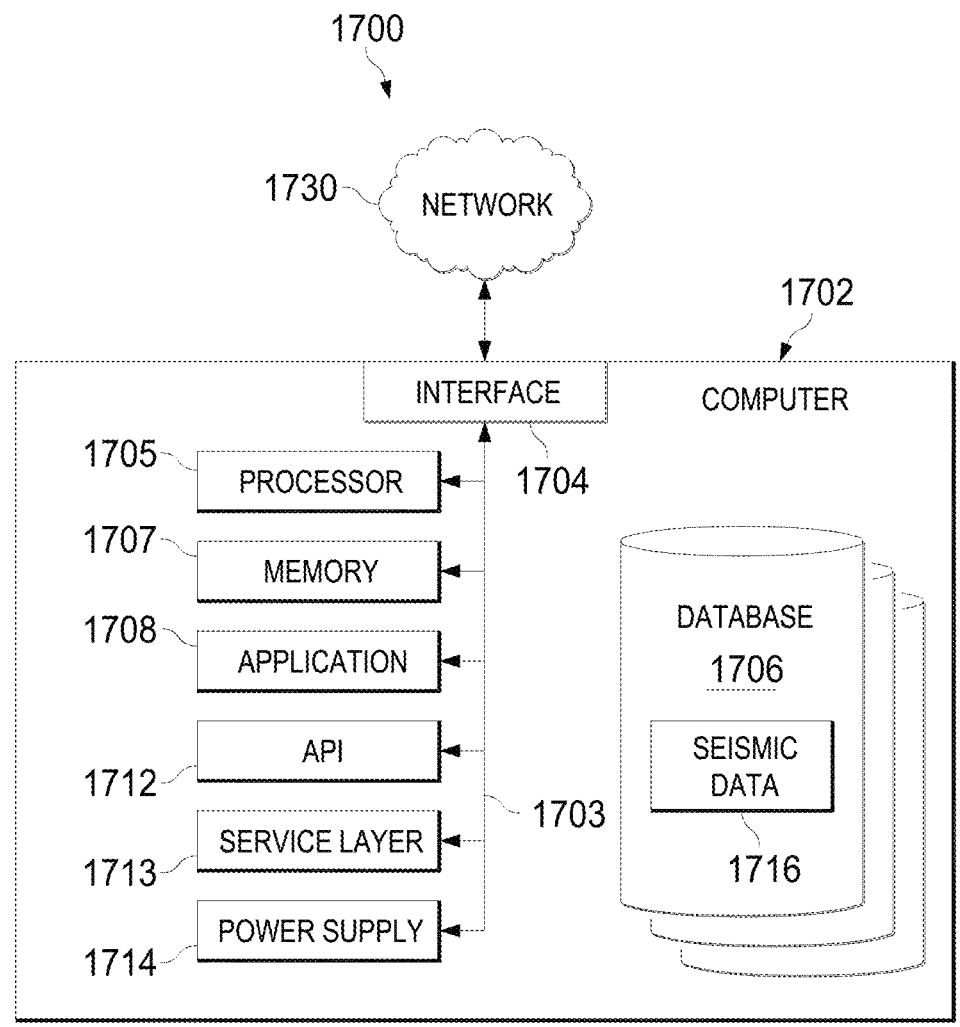
FIG. 17 is a block diagram illustrating an example computer system used to provide computational functionalities associated with described algorithms, methods, functions, processes, flows, and procedures according to some implementations of the present disclosure.

FIG. 17 is a block diagram of an example computer system 1700 used to provide computational functionalities associated with described algorithms, methods, functions, processes, flows, and procedures described in the present disclosure, according to some implementations of the present disclosure.

The illustrated computer 1702 is intended to encompass any computing device such as a server, a desktop computer, a laptop/notebook computer, a wireless data port, a smart phone, a personal data assistant (PDA), a tablet computing device, or one or more processors within these devices, including physical instances, virtual instances, or both. The computer 1702 can include input devices such as keypads, keyboards, and touch screens that can accept user information. Also, the computer 1702 can include output devices that can convey information associated with the operation of the computer 1702. The information can include digital data, visual data, audio information, or a combination of information. The information can be presented in a graphical user interface (UI) (or GUI).

The computer 1702 can serve in a role as a client, a network component, a server, a database, a persistency, or components of a computer system for performing the subject matter described in the present disclosure. The illustrated computer 1702 is communicably coupled with a network 1730. In some implementations, one or more components of the computer 1702 can be configured to operate within different environments, including cloud-computing-based environments, local environments, global environments, and combinations of environments.

Generally, the computer 1702 is an electronic computing device operable to receive, transmit, process, store, and manage data and information associated with the described subject matter. According to some implementations, the computer 1702 can also include, or be communicably coupled with, an application server, an email server, a web server, a caching server, a streaming data server, or a combination of servers.

The computer 1702 can receive requests over network 1730 from a client application (for example, executing on another computer 1702). The computer 1702 can respond to the received requests by processing the received requests using software applications. Requests can also be sent to the computer 1702 from internal users (for example, from a command console), external (or third) parties, automated applications, entities, individuals, systems, and computers.

Each of the components of the computer 1702 can communicate using a system bus 1703. In some implementations, any or all of the components of the computer 1702, including hardware or software components, can interface with each other or the interface 1704 (or a combination of both), over the system bus 1703. Interfaces can use an application programming interface (API) 1712, a service layer 1713, or a combination of the API 1712 and service layer 1713. The API 1712 can include specifications for routines, data structures, and object classes. The API 1712 can be either computer-language independent or dependent. The API 1712 can refer to a complete interface, a single function, or a set of APIs.

The service layer 1713 can provide software services to the computer 1702 and other components (whether illustrated or not) that are communicably coupled to the computer 1702. The functionality of the computer 1702 can be accessible for all service consumers using this service layer. Software services, such as those provided by the service layer 1713, can provide reusable, defined functionalities through a defined interface. For example, the interface can be software written in JAVA, C++, or a language providing data in extensible markup language (XML) format. While illustrated as an integrated component of the computer 1702, in alternative implementations, the API 1712 or the service layer 1713 can be stand-alone components in relation to other components of the computer 1702 and other components communicably coupled to the computer 1702. Moreover, any or all parts of the API 1712 or the service layer 1713 can be implemented as child or sub-modules of another software module, enterprise application, or hardware module without departing from the scope of the present disclosure.

The computer 1702 includes an interface 1704. Although illustrated as a single interface 1704 in FIG. 17, two or more interfaces 1704 can be used according to particular needs, desires, or particular implementations of the computer 1702 and the described functionality. The interface 1704 can be used by the computer 1702 for communicating with other systems that are connected to the network 1730 (whether illustrated or not) in a distributed environment. Generally, the interface 1704 can include, or be implemented using, logic encoded in software or hardware (or a combination of software and hardware) operable to communicate with the network 1730. More specifically, the interface 1704 can include software supporting one or more communication protocols associated with communications. As such, the network 1730 or the interface's hardware can be operable to communicate physical signals within and outside of the illustrated computer 1702.

The computer 1702 includes a processor 1705. Although illustrated as a single processor 1705 in FIG. 17, two or more processors 1705 can be used according to particular needs, desires, or particular implementations of the computer 1702 and the described functionality. Generally, the processor 1705 can execute instructions and can manipulate data to perform the operations of the computer 1702, including operations using algorithms, methods, functions, processes, flows, and procedures as described in the present disclosure.

The computer 1702 also includes a database 1706 that can hold data, including seismic data 1716 (for example, seismic data described earlier at least with reference to FIG. 1), for the computer 1702 and other components connected to the network 1730 (whether illustrated or not). For example, database 1706 can be an in-memory, conventional, or a database storing data consistent with the present disclosure. In some implementations, database 1706 can be a combination of two or more different database types (for example, hybrid in-memory and conventional databases) according to particular needs, desires, or particular implementations of the computer 1702 and the described functionality. Although illustrated as a single database 1706 in FIG. 17, two or more databases (of the same, different, or combination of types) can be used according to particular needs, desires, or particular implementations of the computer 1702 and the described functionality. While database 1706 is illustrated as an internal component of the computer 1702, in alternative implementations, database 1706 can be external to the computer 1702.

The computer 1702 also includes a memory 1707 that can hold data for the computer 1702 or a combination of components connected to the network 1730 (whether illustrated or not). Memory 1707 can store any data consistent with the present disclosure. In some implementations, memory 1707 can be a combination of two or more different types of memory (for example, a combination of semiconductor and magnetic storage) according to particular needs, desires, or particular implementations of the computer 1702 and the described functionality. Although illustrated as a single memory 1707 in FIG. 17, two or more memories 1707 (of the same, different, or combination of types) can be used according to particular needs, desires, or particular implementations of the computer 1702 and the described functionality. While memory 1707 is illustrated as an internal component of the computer 1702, in alternative implementations, memory 1707 can be external to the computer 1702.

The application 1708 can be an algorithmic software engine providing functionality according to particular needs, desires, or particular implementations of the computer 1702 and the described functionality. For example, application 1708 can serve as one or more components, modules, or applications. Further, although illustrated as a single application 1708, the application 1708 can be implemented as multiple applications 1708 on the computer 1702. In addition, although illustrated as internal to the computer 1702, in alternative implementations, the application 1708 can be external to the computer 1702.

The computer 1702 can also include a power supply 1714. The power supply 1714 can include a rechargeable or non-rechargeable battery that can be configured to be either user- or non-user-replaceable. In some implementations, the power supply 1714 can include power-conversion and management circuits, including recharging, standby, and power management functionalities. In some implementations, the power-supply 1714 can include a power plug to allow the computer 1702 to be plugged into a wall socket or a power source to, for example, power the computer 1702 or recharge a rechargeable battery.

There can be any number of computers 1702 associated with, or external to, a computer system containing computer 1702, with each computer 1702 communicating over network 1730. Further, the terms "client," "user," and other appropriate terminology can be used interchangeably, as appropriate, without departing from the scope of the present disclosure. Moreover, the present disclosure contemplates that many users can use one computer 1702 and one user can use multiple computers 1702.

Implementations of the subject matter and the functional operations described in this specification can be implemented in digital electronic circuitry, in tangibly embodied computer software or firmware, in computer hardware, including the structures disclosed in this specification and their structural equivalents, or in combinations of one or more of them. Software implementations of the described subject matter can be implemented as one or more computer programs. Each computer program can include one or more modules of computer program instructions encoded on a tangible, non-transitory, computer-readable computer-storage medium for execution by, or to control the operation of, data processing apparatus. Alternatively, or additionally, the program instructions can be encoded in/on an artificially generated propagated signal. The example, the signal can be a machine-generated electrical, optical, or electromagnetic signal that is generated to encode information for transmission to suitable receiver apparatus for execution by a data processing apparatus. The computer-storage medium can be a machine-readable storage device, a machine-readable storage substrate, a random or serial access memory device, or a combination of computer-storage mediums.

The terms "data processing apparatus," "computer," and "electronic computer device" (or equivalent as understood by one of ordinary skill in the art) refer to data processing hardware. For example, a data processing apparatus can encompass all kinds of apparatus, devices, and machines for processing data, including by way of example, a programmable processor, a computer, or multiple processors or computers. The apparatus can also include special purpose logic circuitry including, for example, a central processing unit (CPU), a field programmable gate array (FPGA), or an application specific integrated circuit (ASIC). In some implementations, the data processing apparatus or special purpose logic circuitry (or a combination of the data processing apparatus or special purpose logic circuitry) can be hardware- or software-based (or a combination of both hardware- and software-based). The apparatus can optionally include code that creates an execution environment for computer programs, for example, code that constitutes processor firmware, a protocol stack, a database management system, an operating system, or a combination of execution environments. The present disclosure contemplates the use of data processing apparatuses with or without conventional operating systems, for example, LINUX, UNIX, WINDOWS, MAC OS, ANDROID, or IOS.

A computer program, which can also be referred to or described as a program, software, a software application, a module, a software module, a script, or code, can be written in any form of programming language. Programming languages can include, for example, compiled languages, interpreted languages, declarative languages, or procedural languages. Programs can be deployed in any form, including as stand-alone programs, modules, components, subroutines, or units for use in a computing environment. A computer program can, but need not, correspond to a file in a file system. A program can be stored in a portion of a file that holds other programs or data, for example, one or more scripts stored in a markup language document, in a single file dedicated to the program in question, or in multiple coordinated files storing one or more modules, sub programs, or portions of code. A computer program can be deployed for execution on one computer or on multiple computers that are located, for example, at one site or distributed across multiple sites that are interconnected by a communication network. While portions of the programs illustrated in the various figures may be shown as individual modules that implement the various features and functionality through various objects, methods, or processes, the programs can instead include a number of sub-modules, third-party services, components, and libraries. Conversely, the features and functionality of various components can be combined into single components as appropriate. Thresholds used to make computational determinations can be statically, dynamically, or both statically and dynamically determined.

The methods, processes, or logic flows described in this specification can be performed by one or more programmable computers executing one or more computer programs to perform functions by operating on input data and generating output. The methods, processes, or logic flows can also be performed by, and apparatus can also be implemented as, special purpose logic circuitry, for example, a CPU, an FPGA, or an ASIC.

Computers suitable for the execution of a computer program can be based on one or more of general and special purpose microprocessors and other kinds of CPUs. The elements of a computer are a CPU for performing or executing instructions and one or more memory devices for storing instructions and data. Generally, a CPU can receive instructions and data from (and write data to) a memory. A computer can also include, or be operatively coupled to, one or more mass storage devices for storing data. In some implementations, a computer can receive data from, and transfer data to, the mass storage devices including, for example, magnetic, magneto optical disks, or optical disks. Moreover, a computer can be embedded in another device, for example, a mobile telephone, a personal digital assistant (PDA), a mobile audio or video player, a game console, a global positioning system (GPS) receiver, or a portable storage device such as a universal serial bus (USB) flash drive.

Computer readable media (transitory or non-transitory, as appropriate) suitable for storing computer program instructions and data can include all forms of permanent/non-permanent and volatile/non-volatile memory, media, and memory devices. Computer readable media can include, for example, semiconductor memory devices such as random access memory (RAM), read only memory (ROM), phase change memory (PRAM), static random access memory (SRAM), dynamic random access memory (DRAM), erasable programmable read-only memory (EPROM), electrically erasable programmable read-only memory (EEPROM), and flash memory devices. Computer readable media can also include, for example, magnetic devices such as tape, cartridges, cassettes, and internal/removable disks. Computer readable media can also include magneto optical disks and optical memory devices and technologies including, for example, digital video disc (DVD), CD ROM, DVD+/−R, DVD-RAM, DVD-ROM, HD-DVD, and BLU-RAY. The memory can store various objects or data, including caches, classes, frameworks, applications, modules, backup data, jobs, web pages, web page templates, data structures, database tables, repositories, and dynamic information. Types of objects and data stored in memory can include parameters, variables, algorithms, instructions, rules, constraints, and references. Additionally, the memory can include logs, policies, security or access data, and reporting files. The processor and the memory can be supplemented by, or incorporated in, special purpose logic circuitry.

Implementations of the subject matter described in the present disclosure can be implemented on a computer having a display device for providing interaction with a user, including displaying information to (and receiving input from) the user. Types of display devices can include, for example, a cathode ray tube (CRT), a liquid crystal display (LCD), a light-emitting diode (LED), and a plasma monitor. Display devices can include a keyboard and pointing devices including, for example, a mouse, a trackball, or a trackpad. User input can also be provided to the computer through the use of a touchscreen, such as a tablet computer surface with pressure sensitivity or a multi-touch screen using capacitive or electric sensing. Other kinds of devices can be used to provide for interaction with a user, including to receive user feedback including, for example, sensory feedback including visual feedback, auditory feedback, or tactile feedback. Input from the user can be received in the form of acoustic, speech, or tactile input. In addition, a computer can interact with a user by sending documents to, and receiving documents from, a device that is used by the user. For example, the computer can send web pages to a web browser on a user's client device in response to requests received from the web browser.

The term "graphical user interface," or "GUI," can be used in the singular or the plural to describe one or more graphical user interfaces and each of the displays of a particular graphical user interface. Therefore, a GUI can represent any graphical user interface, including, but not limited to, a web browser, a touch screen, or a command line interface (CLI) that processes information and efficiently presents the information results to the user. In general, a GUI can include a plurality of user interface (UI) elements, some or all associated with a web browser, such as interactive fields, pull-down lists, and buttons. These and other UI elements can be related to or represent the functions of the web browser.

Implementations of the subject matter described in this specification can be implemented in a computing system that includes a back end component, for example, as a data server, or that includes a middleware component, for example, an application server. Moreover, the computing system can include a front-end component, for example, a client computer having one or both of a graphical user interface or a Web browser through which a user can interact with the computer. The components of the system can be interconnected by any form or medium of wireline or wireless digital data communication (or a combination of data communication) in a communication network. Examples of communication networks include a local area network (LAN), a radio access network (RAN), a metropolitan area network (MAN), a wide area network (WAN), Worldwide Interoperability for Microwave Access (WIMAX), a wireless local area network (WLAN) (for example, using 802.11 a/b/g/n or 802.20 or a combination of protocols), all or a portion of the Internet, or any other communication system or systems at one or more locations (or a combination of communication networks). The network can communicate with, for example, Internet Protocol (IP) packets, frame relay frames, asynchronous transfer mode (ATM) cells, voice, video, data, or a combination of communication types between network addresses.

The computing system can include clients and servers. A client and server can generally be remote from each other and can typically interact through a communication network. The relationship of client and server can arise by virtue of computer programs running on the respective computers and having a client-server relationship. Cluster file systems can be any file system type accessible from multiple servers for read and update. Locking or consistency tracking may not be necessary since the locking of exchange file system can be done at application layer. Furthermore, Unicode data files can be different from non-Unicode data files.

While this specification contains many specific implementation details, these should not be construed as limitations on the scope of what may be claimed, but rather as descriptions of features that may be specific to particular implementations. Certain features that are described in this specification in the context of separate implementations can also be implemented, in combination, in a single implementation. Conversely, various features that are described in the context of a single implementation can also be implemented in multiple implementations, separately, or in any suitable sub-combination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

Particular implementations of the subject matter have been described. Other implementations, alterations, and permutations of the described implementations are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations may be considered optional), to achieve desirable results. In certain circumstances, multitasking or parallel processing (or a combination of multitasking and parallel processing) may be advantageous and performed as deemed appropriate.

Moreover, the separation or integration of various system modules and components in the previously described implementations should not be understood as requiring such separation or integration in all implementations, and it should be understood that the described program components and systems can generally be integrated together in a single software product or packaged into multiple software products.

Accordingly, the previously described example implementations do not define or constrain the present disclosure. Other changes, substitutions, and alterations are also possible without departing from the spirit and scope of the present disclosure.

Furthermore, any claimed implementation is considered to be applicable to at least a computer-implemented method; a non-transitory, computer-readable medium storing computer-readable instructions to perform the computer-implemented method; and a computer system comprising a computer memory interoperably coupled with a hardware processor configured to perform the computer-implemented method or the instructions stored on the non-transitory, computer-readable medium.

Particular embodiments of the subject matter have been described. Other embodiments are within the scope of the following claims. For example, the actions recited in the claims can be performed in a different order and still achieve desirable results. As one example, some processes depicted in the accompanying figures do not necessarily require the particular order shown, or sequential order, to achieve desirable results.

What is claimed is:

1. A method for determining properties of a reservoir in a subterranean region using a geological model based on seismic data and transient pressure data, the method comprising:
obtaining the geological model of the reservoir with petrophysical properties;
populating a dynamic model of the reservoir with the petrophysical properties from the geological model;
obtaining transient pressure data from a plurality of wells in the reservoir;

generating and calibrating a plurality of sector models, each of the plurality of sector models corresponding to one of the plurality of wells in the subterranean region:
for each sector model, update corresponding portions of the dynamic model with data from the sector model;
performing geostatistical distribution to populate portions of the dynamic model for intermediate regions between the plurality of sector models; and
calibrating the petrophysical properties of the intermediate regions of the dynamic model by:
selecting one of the plurality of sector models;
removing data associated with the selected sector model from the dynamic model;
performing geostatistical distribution to populate petrophysical properties of the dynamic model for the selected sector model and intermediate regions between the selected sector model and adjacent sector models; and
calibrating petrophysical properties for the intermediate regions between the selected sector model and adjacent sector models by running the dynamic model for the selected sector model and the intermediate regions between the selected sector model and adjacent sector models,
comparing results of running the dynamic model with observed pressure test data for the selected sector model, and
iteratively adjusting the petrophysical properties for the intermediate regions between the selected sector model and adjacent sector models until the model results for each value in a first set of values is within a threshold measure of accuracy to values in the transient pressure data for the well of the selected sector model.

2. The method of claim 1, wherein calibrating the petrophysical properties of the intermediate regions of the dynamic model comprises:
selecting a second, different sector model of the plurality of sector models;
removing data associated with the second, different sector model; and
performing geostatistical distribution to populate petrophysical properties of the dynamic model for the selected second sector model and intermediate regions between the selected second sector model and adjacent sector models; and
calibrating petrophysical properties for the intermediate regions between the selected second sector model and adjacent sector models by running the dynamic model for the selected second sector model and the intermediate regions between the selected second sector model and the adjacent sector models.

3. The method of claim 2, wherein calibrating the petrophysical properties of the intermediate regions of the dynamic model comprises:
comparing results of running the dynamic model with observed pressure test data for the selected second sector model, and
iteratively adjusting the petrophysical properties for the intermediate regions between the selected second sector model and adjacent sector models until the model results for each value in a second set of values is within a threshold measure of accuracy to values in the transient pressure data for the well of the selected second sector model.

4. The method of claim 2, wherein calibrating petrophysical properties for intermediate regions between the selected second sector model and adjacent sector models comprises:
estimating a second set of values, wherein the values of the second set of values are:
estimated based on geostatistics applied to the transient pressure data for the well of the selected second sector model; and
indicative of petrophysical properties for the well of the selected second sector model and the intermediate regions between the selected second sector model and adjacent sector models.

5. The method of claim 1, further comprising:
validating accuracy of the first set of values in response to determining each value in the first set of values that indicate petrophysical properties of the intermediate regions between the selected sector model and adjacent sector models is within the threshold measure of accuracy to corresponding values in the seismic data and transient pressure data for the well of the selected sector model; and
integrating the first set of values into the dynamic model to generate an updated dynamic model of the reservoir that models dynamic properties of the reservoir.

6. The method of claim 4, further comprising:
validating accuracy of the second set of values in response to determining each value in the second set of values that indicate petrophysical properties of the intermediate regions between the selected second sector model and adjacent sector models is within a threshold measure of accuracy to corresponding values in the seismic data and transient pressure data for the well of the selected second sector model; and
integrating the second set of values into the dynamic model to generate an updated dynamic model of the reservoir that models dynamic properties of the reservoir.

7. The method of claim 1, wherein the subterranean region includes a plurality of intermediate regions each intermediate region being associated with at least one of the plurality of wells and the method further comprises:
iteratively, for each of the plurality of sector models:
selecting a particular sector model;
removing data associated with the particular sector model from the dynamic model;
performing geostatistical distribution to populate petrophysical properties of the dynamic model for the particular sector model and the intermediate regions between the particular sector model and adjacent sector models; and
calibrating petrophysical properties for the intermediate regions between the particular sector model and adjacent sector models by running the dynamic model for the particular sector model and the intermediate regions between the particular sector model and adjacent sector models,
comparing results of running the dynamic model with observed pressure test data for the particular sector model, and
iteratively adjusting the petrophysical properties for the intermediate regions between the selected sector model and adjacent sector models until the model results for each value in a particular set of values is within the threshold measure of accuracy to values in the transient pressure data for the well of the particular sector model.

8. The method of claim 7, further comprising:
validating accuracy of the particular set of values in response to determining each value in the particular set of values that indicate petrophysical properties of the intermediate regions between the particular sector model and adjacent sector models is within a threshold measure of accuracy to corresponding values in the seismic data and transient pressure data for the well of the particular sector model.

9. The method of claim 8, further comprising:
integrating the particular set of values into the dynamic model to generate an updated dynamic model of the reservoir; and
in response to integrating the particular set of values, generating the updated dynamic reservoir model that models the dynamic properties of the reservoir at least by accounting for petrophysical properties specific to each intermediate region of the plurality of intermediate regions in the subterranean region.

10. The method of claim 9, further comprising:
modeling, using the updated dynamic reservoir model, dynamic behaviors and actual operating conditions of the reservoir,
including modeling dynamic behaviors and actual operating conditions of each of the plurality of wells and each of the plurality of intermediate regions.

11. The method of claim 3, wherein:
integrating the first set of values into the dynamic model to generate the dynamic model of the reservoir comprises reinserting, into the dynamic model, the removed data associated with the selected sector model.

12. A system for determining properties of a reservoir in a subterranean region using a geological model based on seismic data and transient pressure data, the system comprising one or more processing devices and one or more non-transitory machine-readable storage devices storing instructions that are executable by the one or more processing devices to cause performance of operations comprising:
obtaining the geological model of the reservoir with petrophysical properties;
populating a dynamic model of the reservoir with the petrophysical properties from the geological model;
obtaining transient pressure data from a plurality of wells in the reservoir;
generating and calibrating a plurality of sector models, each of the plurality of sector models corresponding to one of the plurality of wells in the subterranean region:
for each sector model, update corresponding portions of the dynamic model with data from the sector model;
performing geostatistical distribution to populate portions of the dynamic model for intermediate regions between the plurality of sector models; and
calibrating the petrophysical properties of the intermediate regions of the dynamic model by:
selecting one of the plurality of sector models;
removing data associated with the selected sector model from the dynamic model;
performing geostatistical distribution to populate petrophysical properties of the dynamic model for the selected sector model and intermediate regions between the selected sector model and adjacent sector models; and
calibrating petrophysical properties for the intermediate regions between the selected sector model and adjacent sector models by running the dynamic model for the selected sector model and the intermediate regions between the selected sector model and adjacent sector models,
comparing results of running the dynamic model with observed pressure test data for the selected sector model, and
iteratively adjusting the petrophysical properties for the intermediate regions between the selected sector model and adjacent sector models until the model results for each value in a first set of values is within a threshold measure of accuracy to values in the transient pressure data for the well of the selected sector model.

13. The system of claim 12, wherein calibrating the petrophysical properties of the intermediate regions of the dynamic model comprises:
selecting a second, different sector model of the plurality of sector models;
removing data associated with the second, different sector model; and
performing geostatistical distribution to populate petrophysical properties of the dynamic model for the selected second sector model and intermediate regions between the selected second sector model and adjacent sector models; and
calibrating petrophysical properties for the intermediate regions between the selected second sector model and adjacent sector models by running the dynamic model for the selected second sector model and the intermediate regions between the selected second sector model and the adjacent sector models.

14. The system of claim 13, wherein calibrating the petrophysical properties of the intermediate regions of the dynamic model comprises:
comparing results of running the dynamic model with observed pressure test data for the selected second sector model, and
iteratively adjusting the petrophysical properties for the intermediate regions between the selected second sector model and adjacent sector models until the model results for each value in a second set of values is within a threshold measure of accuracy to values in the transient pressure data for the well of the selected second sector model.

15. The system of claim 13, wherein calibrating petrophysical properties for intermediate regions between the selected second sector model and adjacent sector models comprises:
estimating a second set of values, wherein the values of the second set of values are:
estimated based on geostatistics applied to the transient pressure data for the well of the selected second sector model; and
indicative of petrophysical properties for the well of the selected second sector model and the intermediate regions between the selected second sector model and adjacent sector models.

16. The system of claim 12, wherein the operations further comprise:
validating accuracy of the first set of values in response to determining each value in the first set of values that indicate petrophysical properties of the intermediate regions between the selected sector model and adjacent sector models is within the threshold measure of accuracy to corresponding values in the seismic data and transient pressure data for the well of the selected sector model; and integrating the first set of values into the dynamic model to generate an updated dynamic model of the reservoir that models dynamic properties of the reservoir.

17. The system of claim 15, wherein the operations further comprise:
validating accuracy of the second set of values in response to determining each value in the second set of values that indicate petrophysical properties of the intermediate regions between the selected second sector model and adjacent sector models is within a threshold measure of accuracy to corresponding values in the seismic data and transient pressure data for the well of the selected second sector model; and
integrating the second set of values into the dynamic model to generate an updated dynamic model of the reservoir that models dynamic properties of the reservoir.

18. The system of claim 12, wherein the subterranean region includes a plurality of intermediate regions each intermediate region being associated with at least one of the plurality of wells and the operations further comprise:
iteratively, for each of the plurality of sector models:
selecting a particular sector model;
removing data associated with the particular sector model from the dynamic model;
performing geostatistical distribution to populate petrophysical properties of the dynamic model for the particular sector model and the intermediate regions between the particular sector model and adjacent sector models; and
calibrating petrophysical properties for the intermediate regions between the particular sector model and adjacent sector models by running the dynamic model for the particular sector model and the intermediate regions between the particular sector model and adjacent sector models,
comparing results of running the dynamic model with observed pressure test data for the particular sector model, and
iteratively adjusting the petrophysical properties for the intermediate regions between the selected sector model and adjacent sector models until the model results for each value in a particular set of values is within the threshold measure of accuracy to values in the transient pressure data for the well of the particular sector model.

19. The system of claim 18, wherein the operations further comprise:
validating accuracy of the particular set of values in response to determining each value in the particular set of values that indicate petrophysical properties of the intermediate regions between the particular sector model and adjacent sector models is within a threshold measure of accuracy to corresponding values in the seismic data and transient pressure data for the well of the particular sector model.

20. The system of claim 19, wherein the operations further comprise:
integrating the particular set of values into the dynamic model to generate an updated dynamic model of the reservoir; and
in response to integrating the particular set of values, generating the updated dynamic reservoir model that models the dynamic properties of the reservoir at least by accounting for petrophysical properties specific to each intermediate region of the plurality of intermediate regions in the subterranean region.

21. The system of claim 20, wherein the operations further comprise:
modeling, using the updated dynamic reservoir model, dynamic behaviors and actual operating conditions of the reservoir,
including modeling dynamic behaviors and actual operating conditions of each of the plurality of wells and each of the plurality of intermediate regions.

22. The system of claim 16, wherein:
integrating the first set of values into the dynamic model to generate the dynamic model of the reservoir comprises reinserting, into the dynamic model, the removed data associated with the selected sector model.

23. A non-transitory machine-readable storage device storing instructions for determining properties of a reservoir in a subterranean region using a geological model based on seismic data and transient pressure data, the instructions being executable by a processing device to cause performance of operations comprising:
obtaining the geological model of the reservoir with petrophysical properties;
populating a dynamic model of the reservoir with the petrophysical properties from the geological model;
obtaining transient pressure data from a plurality of wells in the reservoir;
generating and calibrating a plurality of sector models, each of the plurality of sector models corresponding to one of the plurality of wells in the subterranean region:
for each sector model, update corresponding portions of the dynamic model with data from the sector model;
performing geostatistical distribution to populate portions of the dynamic model for intermediate regions between the plurality of sector models; and
calibrating the petrophysical properties of the intermediate regions of the dynamic model by:
selecting one of the plurality of sector models;
removing data associated with the selected sector model from the dynamic model;
performing geostatistical distribution to populate petrophysical properties of the dynamic model for the selected sector model and intermediate regions between the selected sector model and adjacent sector models; and
calibrating petrophysical properties for the intermediate regions between the selected sector model and adjacent sector models by running the dynamic model for the selected sector model and the intermediate regions between the selected sector model and adjacent sector models,
comparing results of running the dynamic model with observed pressure test data for the selected sector model, and
iteratively adjusting the petrophysical properties for the intermediate regions between the selected sector model and adjacent sector models until the model results for each value in a first set of values is within a threshold measure of accuracy to values in the transient pressure data for the well of the selected sector model.

* * * * *